US010256594B2

United States Patent
Onose et al.

(10) Patent No.: US 10,256,594 B2
(45) Date of Patent: Apr. 9, 2019

(54) SOLID-STATE LASER SYSTEM

(71) Applicant: GIGAPHOTON INC., Tochigi (JP)

(72) Inventors: Takashi Onose, Tochigi (JP); Osamu Wakabayashi, Tochigi (JP)

(73) Assignee: Gigaphoton Inc., Tochigi (JP)

( * ) Notice: Subject to any disclaimer, the term of this patent is extended or adjusted under 35 U.S.C. 154(b) by 0 days.

(21) Appl. No.: 15/616,163

(22) Filed: Jun. 7, 2017

(65) Prior Publication Data

US 2017/0279241 A1 Sep. 28, 2017

Related U.S. Application Data

(63) Continuation of application No. PCT/JP2015/086160, filed on Dec. 25, 2015.

(30) Foreign Application Priority Data

Jan. 30, 2015 (WO) .................. PCT/JP2015/052651

(51) Int. Cl.
*H01S 3/091* (2006.01)
*G02F 1/37* (2006.01)
(Continued)

(52) U.S. Cl.
CPC .......... *H01S 3/0912* (2013.01); *G02F 1/3534* (2013.01); *G02F 1/3551* (2013.01);
(Continued)

(58) Field of Classification Search
CPC .... G02F 1/37; H01S 3/0912; H01S 3/094076; H01S 3/109

See application file for complete search history.

(56) References Cited

U.S. PATENT DOCUMENTS 8,634,441 B2 1/2014 Onose et al.
9,077,147 B2 * 7/2015 Shin ...................... H01S 3/2316
(Continued)

FOREIGN PATENT DOCUMENTS

JP 10-339891 A 12/1998
JP 11-233396 A 8/1999
(Continued)

OTHER PUBLICATIONS

International Search Report issued in PCT/JP2015/086160; dated Mar. 29, 2016.

*Primary Examiner* — Daniel Petkovsek
(74) *Attorney, Agent, or Firm* — Studebaker & Brackett PC

(57) ABSTRACT

A solid-state laser system may include first and second solid-state laser units, a wavelength conversion system, an optical shutter, and a controller. The first solid-state laser unit and the second solid-state laser unit may output first pulsed laser light with a first wavelength and second pulsed laser light with a second wavelength, respectively. The controller may perform first control and second control. The first control may cause the first and second pulsed laser light to enter the wavelength conversion system at a substantially coincidental timing, thereby causing the wavelength conversion system to output third pulsed laser light with a third wavelength converted from the first wavelength and the second wavelength, and the second control may prevent the first and second pulsed laser light from entering the wavelength conversion system at the coincidental timing, thereby preventing the wavelength conversion system from outputting the third pulsed laser light.

16 Claims, 18 Drawing Sheets

(51) Int. Cl.

| | | |
|---|---|---|
| *G02F 1/355* | (2006.01) | |
| *H01S 3/06* | (2006.01) | |
| *H01S 3/067* | (2006.01) | |
| *H01S 3/094* | (2006.01) | |
| *H01S 3/0941* | (2006.01) | |
| *H01S 3/107* | (2006.01) | |
| *H01S 3/109* | (2006.01) | |
| *H01S 3/16* | (2006.01) | |
| *G02F 1/35* | (2006.01) | |
| *G03F 7/20* | (2006.01) | |
| *H01S 3/23* | (2006.01) | |
| *H01S 3/00* | (2006.01) | |
| *H01S 3/10* | (2006.01) | |
| *H01S 3/225* | (2006.01) | |

(52) U.S. Cl.
CPC ............ *G02F 1/37* (2013.01); *G03F 7/70025* (2013.01); *H01S 3/0092* (2013.01); *H01S 3/0602* (2013.01); *H01S 3/06754* (2013.01); *H01S 3/0941* (2013.01); *H01S 3/094076* (2013.01); *H01S 3/107* (2013.01); *H01S 3/109* (2013.01); *H01S 3/1666* (2013.01); *H01S 3/2375* (2013.01); *G02F 2001/354* (2013.01); *G02F 2001/3507* (2013.01); *H01S 3/0071* (2013.01); *H01S 3/0085* (2013.01); *H01S 3/10046* (2013.01); *H01S 3/10053* (2013.01); *H01S 3/2251* (2013.01); *H01S 3/2366* (2013.01); *H01S 3/2391* (2013.01)

(56) References Cited

U.S. PATENT DOCUMENTS

| | | | |
|---|---|---|---|
| 9,461,436 B2* | 10/2016 | Noh | H01S 3/0092 |
| 9,608,400 B2* | 3/2017 | Tokuhisa | H01S 3/2391 |
| 2010/0225897 A1* | 9/2010 | Fermann | G01N 21/31 |
| | | | 356/51 |
| 2011/0019705 A1 | 1/2011 | Adams et al. | |
| 2013/0279526 A1 | 10/2013 | Kakizaki et al. | |
| 2015/0303647 A1 | 10/2015 | Tokuhisa | |

FOREIGN PATENT DOCUMENTS

| | | |
|---|---|---|
| JP | 2001-230478 A | 8/2001 |
| JP | 2011-158749 A | 8/2011 |
| JP | 2012-199425 | 10/2012 |
| JP | 2013-222173 A | 10/2013 |
| JP | 2014-053627 A | 3/2014 |
| WO | 2014/021370 A1 | 2/2014 |

* cited by examiner

SOLID-STATE LASER SYSTEM

CROSS REFERENCE TO RELATED APPLICATIONS

The present application is a continuation application of International Application No. PCT/JP2015/086160 filed on Dec. 25, 2015. The content of the application is incorporated herein by reference in its entirety.

BACKGROUND

1. Technical Field

The present disclosure relates to a solid-state laser system.

2. Related Art

With miniaturization and high integration of a semiconductor integrated circuit, an improvement in resolution has been demanded for a semiconductor exposure apparatus. Hereinafter, the semiconductor exposure apparatus is simply referred to as an "exposure apparatus". Shortening in a wavelength of light to be outputted from an exposure light source has been in progress accordingly. A gas laser unit is used in place of an existing mercury lamp for the exposure light source. Currently, a KrF excimer laser unit and an ArF excimer laser unit may be used as gas laser units for exposure. The KrF excimer laser unit may output ultraviolet light with a wavelength of 248 nm, and the ArF excimer laser unit may output ultraviolet light with a wavelength of 193.4 nm.

As current exposure technology, liquid immersion exposure is practically used. In the liquid immersion exposure, a clearance between a projection lens on exposure apparatus side and a wafer is filled with a liquid to change a refractive index of the clearance, thereby shortening an apparent wavelength of light from the exposure light source. When the liquid immersion exposure is performed with use of the ArF excimer laser unit as the exposure light source, ultraviolet light with a wavelength of 134 nm in water is applied to the wafer. This technology is referred to as ArF liquid immersion exposure. The ArF liquid immersion exposure is also referred to as "ArF liquid immersion lithography".

Since a spectral line width in free oscillation of each of the KrF excimer laser unit and the ArF excimer laser unit is wide, e.g., in a range from about 350 pm to about 400 pm, color aberration of laser light (ultraviolet light) that is reduced and projected on the wafer by the projection lens on the exposure apparatus side occurs, which results in decrease in resolution. It is therefore necessary to narrow a spectral line width of laser light to be outputted from the gas laser unit to an extent in which the color aberration is negligible. The spectral line width is also referred to as "spectral width". Accordingly, a line narrow module including a line narrowing device is provided in a laser resonator of the gas laser unit, which achieves narrowing of the spectral width. Non-limiting examples of the line narrowing device may include an etalon and a grating. The laser unit narrowed in spectral width in this way is referred to as "line narrowing laser unit". For example, reference is made to Japanese Unexamined Patent Application Publication No. 2012-199425, Japanese Unexamined Patent Application Publication No. 2013-222173, U.S. Pat. No. 8,634,441, and U.S. Patent Application Publication No. 2013/0279526.

SUMMARY

A solid-state laser system according to a first aspect of the present disclosure may include a first solid-state laser unit, a second solid-state laser unit, a wavelength conversion system, an optical shutter, and a controller. The first solid-state laser unit may be configured to output first pulsed laser light with a first wavelength. The second solid-state laser unit may be configured to output second pulsed laser light with a second wavelength. The first pulsed laser light and the second pulsed laser light may enter the wavelength conversion system. The optical shutter may be provided in an optical path of one or both of the first pulsed laser light and the second pulsed laser light. The controller may be configured to cause the first pulsed laser light and the second pulsed laser light to be continuously outputted from the first solid-state laser unit and the second solid-state laser unit, respectively, and perform first control in which the optical shutter is opened while a burst signal from an external unit is on and second control in which the optical shutter is closed while the burst signal is off. The first control may cause the first pulsed laser light and the second pulsed laser light to enter the wavelength conversion system at a substantially coincidental timing, thereby causing the wavelength conversion system to output third pulsed laser light with a third wavelength that is converted from the first wavelength and the second wavelength. The second control may prevent the first pulsed laser light and the second pulsed laser light from entering the wavelength conversion system at the coincidental timing, thereby preventing the wavelength conversion system from outputting the third pulsed laser light.

A solid-state laser system according to a second aspect of the present disclosure may include a first solid-state laser unit, a second solid-state laser unit, a wavelength conversion system, and a controller. The first solid-state laser unit may be configured to output first pulsed laser light with a first wavelength. The second solid-state laser unit may be configured to output second pulsed laser light with a second wavelength. The first pulsed laser light and the second pulsed laser light may enter the wavelength conversion system. The controller may be configured to cause the first pulsed laser light and the second pulsed laser light to be continuously outputted from the first solid-state laser unit and the second solid-state laser unit, respectively. The controller may be configured to cause, while a burst signal from an external unit is on, the first pulsed laser light and the second pulsed laser light to enter the wavelength conversion system at a substantially coincidental timing, thereby causing the wavelength conversion system to output third pulsed laser light with a third wavelength that is converted from the first wavelength and the second wavelength, and may be configured to cause, while the burst signal is off, the first pulsed laser light and the second pulsed laser light to enter the wavelength conversion system at different timings from each other, thereby preventing the wavelength conversion system from outputting the third pulsed laser light. A difference between the different timings may be equal to or greater than sum of a pulse width of the first pulsed laser light and a pulse width of the second pulsed laser light.

A solid-state laser system according to a third aspect of the present disclosure may include a first solid-state laser unit, a second solid-state laser unit, a wavelength conversion system, a light intensity varying section, and a controller. The first solid-state laser unit may be configured to output first pulsed laser light with a first wavelength. The second solid-state laser unit may be configured to output second pulsed laser light with a second wavelength. The first pulsed laser light and the second pulsed laser light may enter the wavelength conversion system. The light intensity varying section may be configured to vary light intensity of one or both of the first pulsed laser light and the second pulsed laser light. The controller may be configured to cause the first pulsed laser light and the second pulsed laser light to enter the wavelength conversion system at a substantially coincidental timing. The controller may be configured to control the light intensity varying section to control, while a burst signal from an external unit is on, the light intensity of each of the first pulsed laser light and the second pulsed laser light, thereby causing the wavelength conversion system to output third pulsed laser light with a third wavelength that is converted from the first wavelength and the second wavelength, and may be configured to control the light intensity varying section to control, while the burst signal is off, the light intensity of one or both of the first pulsed laser light and the second pulsed laser light, thereby preventing the wavelength conversion system from outputting the third pulsed laser light.

BRIEF DESCRIPTION OF THE DRAWINGS

Some example embodiments of the present disclosure are described below as mere examples with reference to the accompanying drawings.

DETAILED DESCRIPTION

Figure 1:
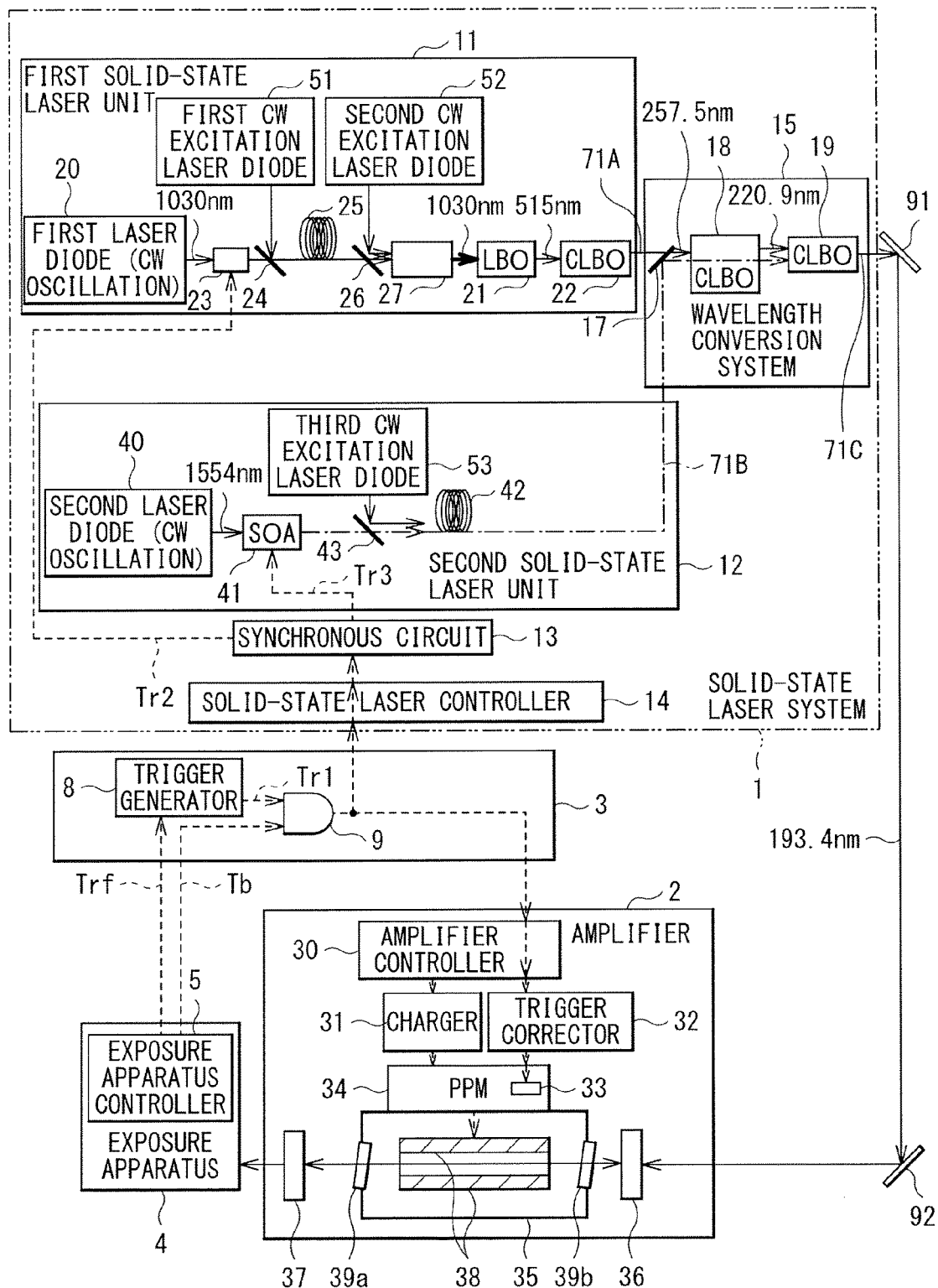
FIG. 1 schematically illustrates a configuration example of a laser apparatus that is used for an exposure apparatus and includes a solid-state laser system according to a comparative example.

<Contents>
[1. Overview]
[2. Comparative Example] (Laser apparatus that is used for an exposure apparatus and includes a solid-state layer system)
   2.1 Configuration (FIG. 1)
   2.2 Operation
   2.3 Issues (FIGS. 3 to 5)
[3. First Embodiment] (FIGS. 6 and 7)
   3.1 Configuration
   3.2 Operation
   3.3 Workings
   3.4 Modification Example
[4. Second Embodiment] (FIGS. 8, 9, and 17)
   4.1 Configuration
   4.2 Operation
   4.3 Workings
[5. Third Embodiment] (FIGS. 10 to 13)
   5.1 Configuration
   5.2 Operation
   5.3 Workings
[6. Fourth Embodiment] (FIGS. 14 and 15)
   6.1 Configuration
   6.2 Operation
   6.3 Workings
   6.4 Modification Example
[7. Configuration Example of Optical Shutter] (FIG. 16)
   7.1 Configuration
   7.2 Operation
[8. Hardware Environment of Controller] (FIG. 18)
[9. Et Cetera]

In the following, some example embodiments of the present disclosure are described in detail with reference to the drawings. Example embodiments described below each illustrate one example of the present disclosure and are not intended to limit the contents of the present disclosure. Further, all of the configurations and operations described in each example embodiment are not necessarily essential for the configurations and operations of the present disclosure. Note that like components are denoted by like reference numerals, and redundant description thereof is omitted.

1. OVERVIEW

The present disclosure relates to a solid-state laser system that generates, for example, a burst pulse.

2. COMPARATIVE EXAMPLE

First, description is given of a laser apparatus that is used for an exposure apparatus and includes a solid-state laser system according to a comparative example with respect to example embodiments of the present disclosure.

The laser apparatus used for the exposure apparatus may have a configuration including a master oscillator (MO) and a power oscillator (PO). In such a laser apparatus used for the exposure apparatus, a laser using an excimer laser gas as a laser medium may be used for the MO and the PO. However, in term of energy saving, development of a laser apparatus that is used for an exposure apparatus and includes a solid-state laser system as an MO is in progress. The solid-state laser system is configured of a combination of a nonlinear crystal and a solid-state laser, and outputs pulsed ultraviolet laser light. In the following, description is given of a configuration example of the laser apparatus that is used for the exposure apparatus and includes such a solid-state laser system.

(2.1 Configuration)

FIG. 1 schematically illustrates a configuration example of the laser apparatus used for the exposure apparatus according to the comparative example with respect to example embodiments of the present disclosure.

The laser apparatus used for the exposure apparatus may include a solid-state laser system 1, an amplifier 2, a burst pulse controller 3, and high reflection mirrors 91 and 92. The solid-state laser system 1 may include a first solid-state laser unit 11, a second solid-state laser unit 12, a synchronous circuit 13, a solid-state laser controller 14, and a wavelength conversion system 15. The burst pulse controller 3 may include a trigger generator 8 and an AND circuit 9.

The laser apparatus used for the exposure apparatus may be demanded to perform a burst operation. Through the burst operation, a wafer is irradiated with pulsed laser light at a predetermined repetition frequency f over a predetermined time period during exposure, and thereafter, oscillation of the pulsed laser light is stopped over a predetermined time period for a shift toward exposure on the next wafer. The predetermined repetition frequency f of the pulsed laser light may be in a range from 50 kHz to 100 kHz both inclusive, for example. Output of pulsed light at the predetermined repetition frequency f over the predetermined time period may be referred to as "burst" in some cases. Further, pulsed light outputted through the burst may be referred to as "burst pulse".

A burst signal Tb that gives an instruction for generation of pulsed laser light through such burst may be supplied from an exposure apparatus 4 as an external unit to the burst pulse controller 3. Moreover, a frequency signal Trf that indicates the predetermined repetition frequency f may be supplied from the exposure apparatus 4 to the burst pulse controller 3. The exposure apparatus 4 may include an exposure apparatus controller 5. The frequency signal Trf and the burst signal Tb may be supplied from the exposure apparatus controller 5 of the exposure apparatus 4.

The burst signal Tb from the exposure apparatus controller 5 and a first trigger signal Tr1 from the trigger generator 8 may be inputted to the AND circuit 9. The trigger generator 8 may be configured to receive the frequency signal Trf from the exposure apparatus controller 5 and generate the first trigger signal Tr1.

The first solid-state laser unit 11 may be configured to output first pulsed laser light 71A with a first wavelength toward the wavelength conversion system 15. The first wavelength may be 257.5 nm. The first solid-state laser unit 11 may include a first laser diode 20, a first optical shutter 23, a beam splitter 24, a first fiber amplifier 25, a beam splitter 26, and a solid-state amplifier 27. Moreover, the first solid-state laser unit 11 may include a LBO ($LiB_3O_5$) crystal 21, a CLBO ($CsLiB_6O_{10}$) crystal 22, a first continuous wave (CW) excitation laser diode 51, and a second CW excitation laser diode 52.

The first laser diode 20 may be a distributed-feedback laser diode that oscillates in a CW mode to output seed light with a wavelength of 1030 nm. The first optical shutter 23 may be configured of a combination of an electro-optical (EO) Pockels cell and a polarizer.

The second solid-state laser unit 12 may be configured to output second pulsed laser light 71B with a second wavelength toward the wavelength conversion system 15. The second wavelength may be 1554 nm. The second solid-state laser unit 12 may include a second laser diode 40, a semiconductor optical amplifier (SOA) 41, a second fiber amplifier 42, a beam splitter 43, and a third CW excitation laser diode 53.

The second laser diode 40 may be a distributed-feedback laser diode that oscillates in the CW mode to output seed light with a wavelength of 1554 nm.

The wavelength conversion system 15 may include a beam splitter 17 and two CLBO ($CsLiB_6O_{10}$) crystals 18 and 19. The wavelength conversion system 15 may be configured so that the first pulsed laser light 71A with the first wavelength and the second pulsed laser light 71B with the second wavelength enter the wavelength conversion system 15 at a substantially coincidental timing. The wavelength conversion system 15 may be configured to output third pulsed laser light 71C with a third wavelength that is converted from the first wavelength and the second wavelength. The third wavelength may be 193.4 nm.

Spectral line widths of the first laser diode 20 and the second laser diode 40 may be set to cause a spectral line width of the third pulsed laser light 71C with 193.4 nm converted by the wavelength conversion system 15 to be an acceptable line width of the exposure apparatus 4.

The solid-state laser controller 14 may be coupled to the first laser diode 20, the second laser diode 40, the first CW excitation laser diode 51, the second CW excitation laser diode 52, and the third CW excitation laser diode 53 through unillustrated signal lines.

The synchronous circuit 13 may be configured to output a second trigger signal Tr2 to the first optical shutter 23 of the first solid-state laser unit 11. Moreover, the synchronous circuit 13 may be configured to output a third trigger signal Tr3 to the semiconductor optical amplifier 41 of the second solid-state laser unit 12.

The amplifier 2 may include an amplifier controller 30, a charger 31, a trigger corrector 32, a pulsed power module (PPM) 34 including a switch 33, a chamber 35, a partial reflection mirror 36, and an output coupling mirror 37.

The chamber 35 may be provided with windows 39a and 39b. The chamber 35 may contain, for example, a laser gas containing an Ar gas, a $F_2$ gas, and a Ne gas. A pair of discharge electrodes 38 may be provided inside the chamber 35. The pair of discharge electrodes 38 may be coupled to an output terminal of the PPM 34.

In the amplifier 2, an optical resonator including the partial reflection mirror 36 and the output coupling mirror 37 may be configured. The partial reflection mirror 36 may be configured of, for example, a substrate coated with a partial reflection film having reflectivity from 70% to 90% both inclusive. The substrate may be made of a $CaF_2$ crystal that allows, for example, light with a wavelength of 193.4 nm to pass therethrough. The output coupling mirror 37 may be configured of, for example, a substrate coated with a partial reflection film having reflectivity from 10% to 20% both inclusive. The substrate may be made of a $CaF_2$ crystal that allows, for example, light with a wavelength of 193.4 nm to pass therethrough.

The burst pulse controller 3 may be configured to output an oscillation trigger to the trigger corrector 32 via the amplifier controller 30 so as to cause the pair of discharge electrodes 38 to perform discharge in synchronization with injection of the third pulsed laser light 71C into the optical resonator of the amplifier 2.

(2.2 Operation)

The first solid-state laser unit 11 may cause the first laser diode 20, the first CW excitation laser diode 51, and the second CW excitation laser diode 52 to oscillate in the CW mode in accordance with an instruction from the solid-state laser controller 14. The second solid-state laser unit 12 may cause the second laser diode 40 and the third CW excitation laser diode 53 to oscillate in the CW mode in accordance with an instruction from the solid-state laser controller 14.

The exposure apparatus 4 may output the burst signal Tb and the frequency signal Trf to the burst pulse controller 3. The burst signal Tb may be a signal that gives an instruction for generation of a burst pulse while the burst signal Tb is on and stop of generation of the burst pulse while the burst signal Tb is off.

In the burst pulse controller 3, when the trigger generator 8 receives the frequency signal Trf from the exposure apparatus 4, the trigger generator 8 may generate the first trigger signal Tr1 of the predetermined frequency f. In the burst pulse controller 3, the AND circuit 9 may output a burst trigger signal of the predetermined repetition frequency f while the burst signal Tb is on. The AND circuit 9 may stop outputting of the burst trigger signal while the burst signal Tb is off.

The burst trigger signal from the AND circuit 9 may be inputted to the amplifier controller 30. Moreover, the burst trigger signal may be inputted to the switch 33 of the PPM 34 via the amplifier controller 30 and the trigger corrector 32.

Further, the burst trigger signal may be inputted to the synchronous circuit 13 via the solid-state laser controller 14. When the synchronous circuit 13 receives the burst trigger signal, the synchronous circuit 13 may output the second trigger signal Tr2 and the third trigger signal Tr3 to cause the first pulsed laser light 71A and the second pulsed laser light 71B to enter the wavelength conversion system 15 at a substantial coincidental timing. The synchronous circuit 13 may output the second trigger signal Tr2 to the first optical shutter 23 of the first solid-state laser unit 11. The synchronous circuit 13 may output the third trigger signal Tr3 to the semiconductor optical amplifier 41 of the second solid-state laser unit 12.

In the first solid-state laser unit 11, the first laser diode 20 may output CW-oscillated light with a wavelength of 1030 nm as seed light. CW-oscillated seed light with a wavelength of 1030 nm may be trimmed into a pulse form by the first optical shutter 23 on the basis of the second trigger signal Tr2. Subsequently, the pulsed seed light outputted from the first optical shutter 23 and first CW-excited light from the first CW excitation laser diode 51 may enter the first fiber amplifier 25 via the beam splitter 24 to cause the first fiber amplifier 25 to amplify the seed light. Thereafter, the seed light amplified by the first fiber amplifier 25 and second CW-excited light from the second CW excitation laser diode 52 may enter the solid-state amplifier 27 via the beam splitter 26 to be amplified by the solid-state amplifier 27. Next, the LBO crystal 21 and the CLBO crystal 22 may generate a fourth harmonic with a wavelength of 257.5 nm from the seed light amplified by the solid-state amplifier 27. Thus, the first solid-state laser unit 11 may output the first pulsed laser light 71A with a wavelength of 257.5 nm.

In contrast, in the second solid-state laser unit 12, the second laser diode 40 may output CW-oscillated light with a wavelength of 1554 nm as seed light. The CW-oscillated seed light with a wavelength of 1554 nm may be amplified into a pulse form by the semiconductor optical amplifier 41 on the basis of the third trigger signal Tr3. Subsequently, the pulsed seed light outputted from the semiconductor optical amplifier 41 and third CW-oscillated light from the third CW excitation laser diode 53 may enter the second fiber amplifier 42 via the beam splitter 43 to cause the second fiber amplifier 42 to amplify the seed light. Thus, the second solid-state laser unit 12 may output the second pulsed laser light 71B with a wavelength of 1554 nm.

In the wavelength conversion system 15, the beam splitter 17 may cause the first pulsed laser light 71A and the second pulsed laser light 71B to enter the CLBO crystal 18 at a substantially coincidental timing, and the first pulsed laser light 71A and the second pulsed laser light 71B may be superimposed on each other on the CLBO crystal 18. The CLBO crystal 18 may generate pulsed laser light with a wavelength of 220.9 nm as a sum frequency of a wavelength of 257.5 nm and a wavelength of 1554 nm. Subsequently, the CLBO crystal 19 may generate the third pulsed laser light 71C with a wavelength of 193.4 nm as a sum frequency of a wavelength of 220.9 nm and a wavelength of 1554 nm. The third pulsed laser light 71C may enter the partial reflection mirror 36 of the amplifier 2 via the high reflection mirrors 91 and 92.

The third pulsed laser light 71C may be injected as seed light into the optical resonator including the output coupling mirror 37 and the partial reflection mirror 36 of the amplifier 2. Discharge by the pair of discharge electrodes 38 may produce a population inversion in the chamber 35 of the amplifier 2 in synchronization with such injection. At this occasion, the trigger corrector 32 may adjust a timing of the switch 33 of the PPM 34 so as to efficiently amplify, in the amplifier 2, the third pulsed laser light 71C with a wavelength of 193.4 nm from the solid-state laser system 1. As a result, pulsed laser light may be amplified and oscillated by the optical resonator of the amplifier 2, and the thus-amplified pulsed laser light may be outputted from the output coupling mirror 37.

As described above, the burst pulse with a wavelength of 193.4 nm may be generated from the solid-state laser system 1, and the amplifier 2 may operate in synchronization with the burst pulse, thereby outputting the further amplified burst pulse to the exposure apparatus 4.

(2.3 Issues)

Figure 2:
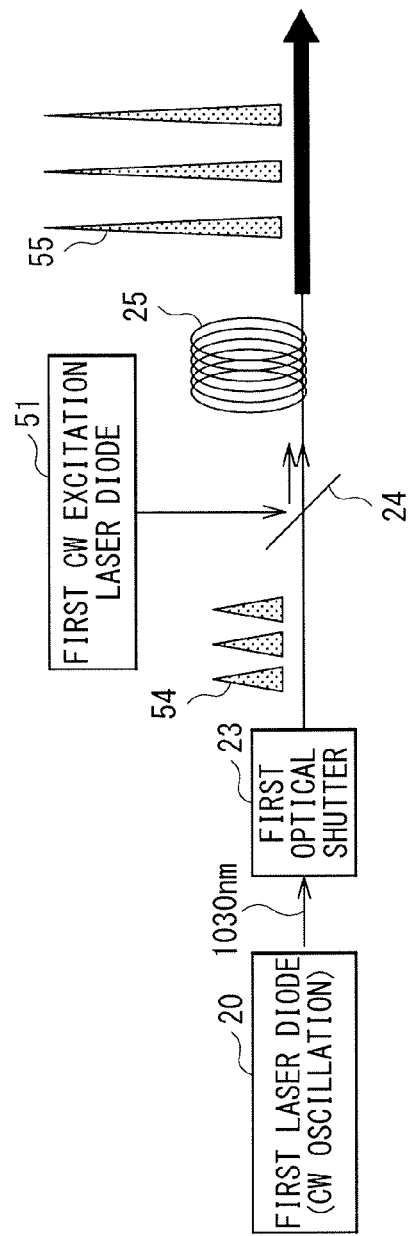
FIG. 2 schematically illustrates an operation example in which a first solid-state laser unit of the solid-state laser system illustrated in FIG. 1 continuously outputs pulsed seed light and amplifies the pulsed seed light.
Figure 3:
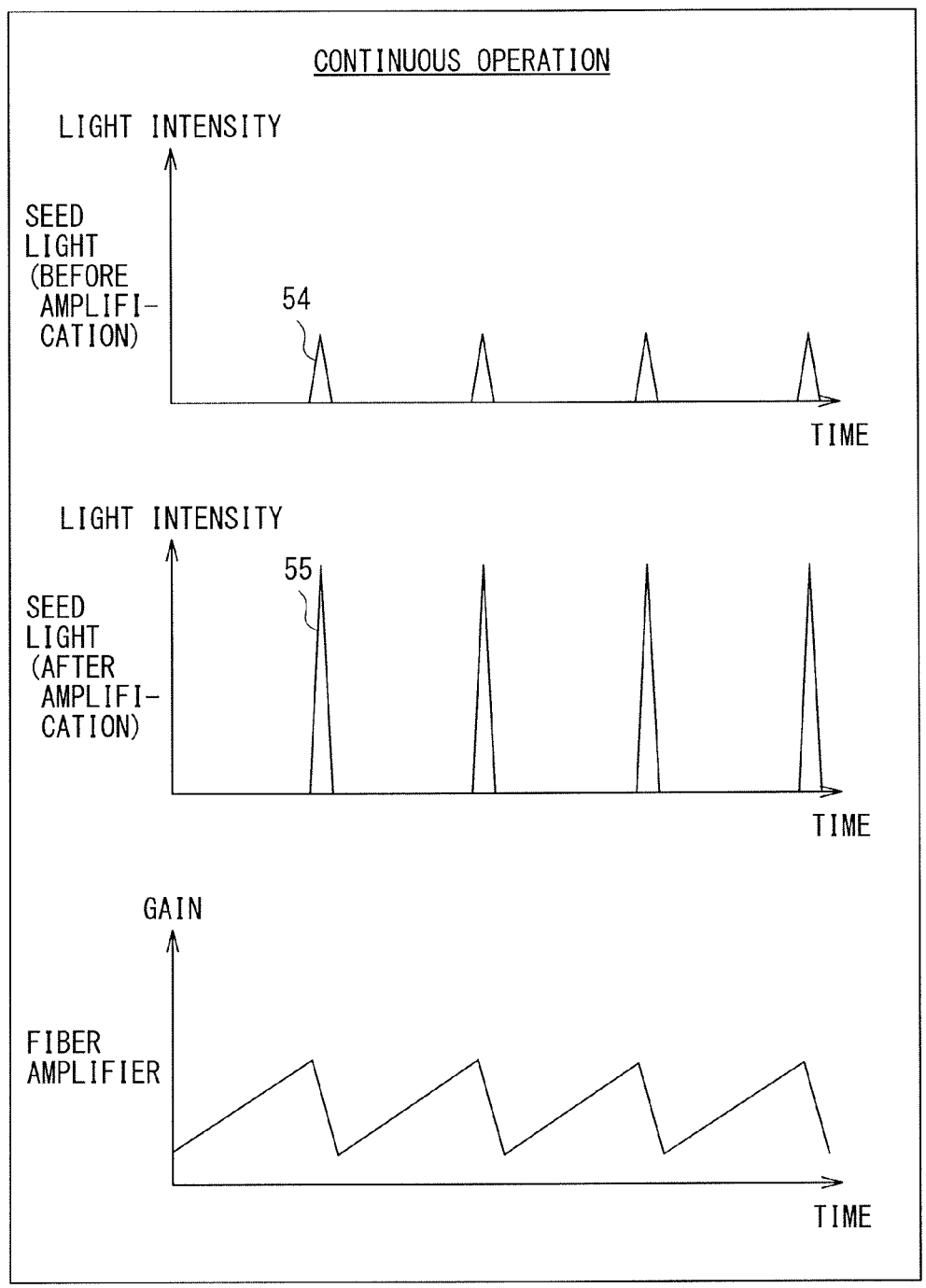
FIG. 3 schematically illustrates variation in gain of a fiber amplifier in a case in which the first solid-state laser unit of the solid-state laser system illustrated in FIG. 1 continuously outputs pulsed seed light and amplifies the pulsed seed light.

FIG. 2 schematically illustrates an operation example in which the first solid-state laser unit 11 of the solid-state laser system 1 illustrated in FIG. 1 continuously outputs pulsed seed light and amplifies the pulsed seed light. FIG. 3 schematically illustrates variation in gain of the first fiber amplifier 25 in a case in which the first solid-state laser unit 11 continuously outputs pulsed seed light and amplifies the pulsed seed light in a similar manner.

Figure 4:
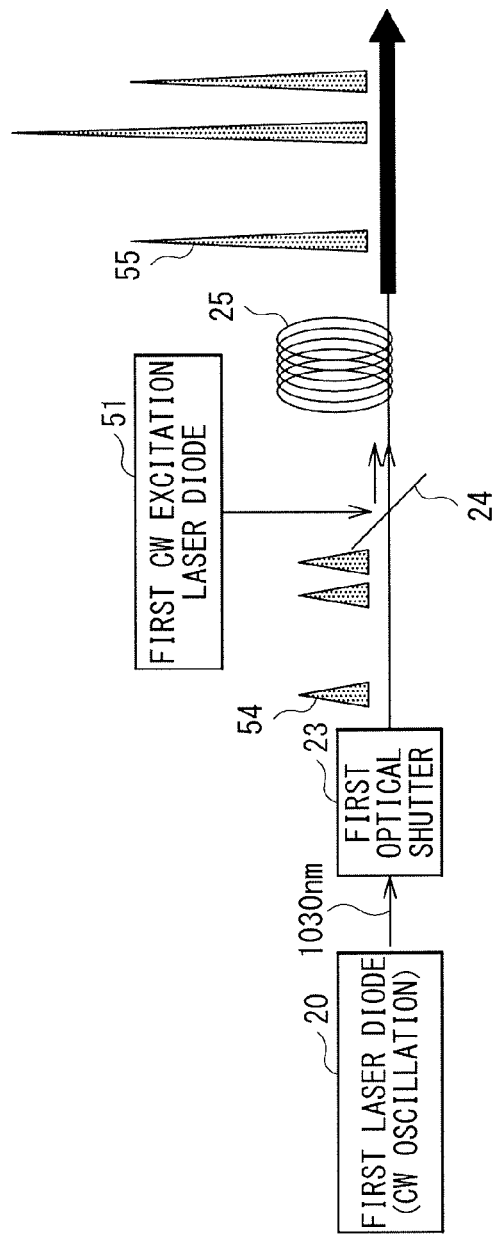
FIG. 4 schematically illustrates an operation example in which the first solid-state laser unit of the solid-state laser system illustrated in FIG. 1 outputs pulsed seed light through burst and amplifies the pulsed seed light.
Figure 5:
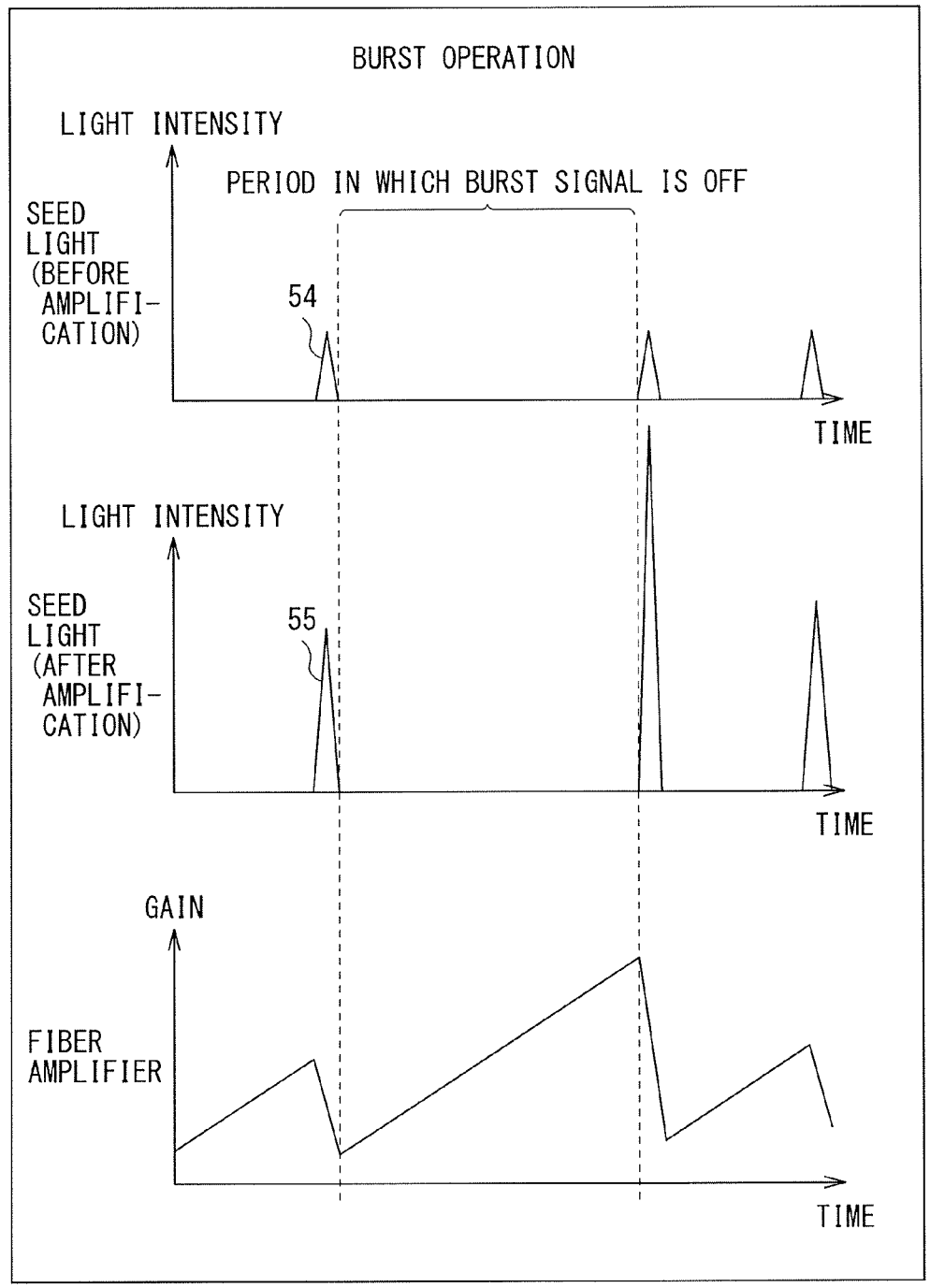
FIG. 5 schematically illustrates variation in gain of the fiber amplifier in a case in which the first solid-state laser unit of the solid-state laser system illustrated in FIG. 1 outputs pulsed seed light through burst and amplifies the pulsed seed light.

FIG. 4 schematically illustrates an operation example in which the first solid-state laser unit 11 of the solid-state laser system 1 illustrated in FIG. 1 outputs pulsed seed light through burst and amplifies the pulsed seed light. FIG. 5 schematically illustrates variation in gain of the first fiber amplifier 25 in a case in which the first solid-state laser unit 11 outputs pulsed seed light through burst and amplifies the pulsed seed light in a similar manner.

In FIGS. 3 and 5, an upper part illustrates a state of seed light 54 before being amplified by the first fiber amplifier 25, where a horizontal axis indicates time, and a vertical axis indicates light intensity. A middle part illustrates a state of seed light 55 having been amplified by the first fiber amplifier 25, where a horizontal axis indicates time, and a vertical axis indicates light intensity. A lower part illustrates variation in gain of the first fiber amplifier 25, where a horizontal axis indicates time, and a vertical axis indicates gain.

The first CW-excited light from the first CW excitation laser diode 51 may be inputted in the CW mode to the first fiber amplifier 25, and the first fiber amplifier 25 may adjust intensity of the seed light 54 so as to bring the gain into balance, thereby adjusting pulse energy, as illustrated in FIGS. 2 and 3. When the seed light 54 is inputted to the first fiber amplifier 25 by a burst operation under this condition, balance of the gain of the first fiber amplifier 25 may be lost by change in a timing of inputting the seed light 54 to the first fiber amplifier 25, as illustrated in FIGS. 4 and 5. As a result, the light intensity of the seed light having been amplified may vary. In particular, light intensity of a head pulse of a burst may become high. At worst, for example, a fiber of the first fiber amplifier 25 or an optical device such as a nonlinear crystal located downstream of the first fiber amplifier 25 may be damaged. Moreover, an increase in thermal load of the optical device such as the nonlinear crystal may change a wavefront, following which wavelength conversion efficiency may thereafter decline or a wavefront of pulsed laser light with a converted wavelength may be distorted.

3. FIRST EMBODIMENT

Next, description is given of a laser apparatus that is used for an exposure apparatus and includes a solid-state laser system according to a first embodiment of the present disclosure. Note that substantially same components as the components of the laser apparatus that is used for the exposure apparatus and includes the solid-state laser system according to the comparative example illustrated in FIG. 1 are denoted by same reference numerals, and redundant description thereof is omitted.

(3.1 Configuration)

Figure 6:
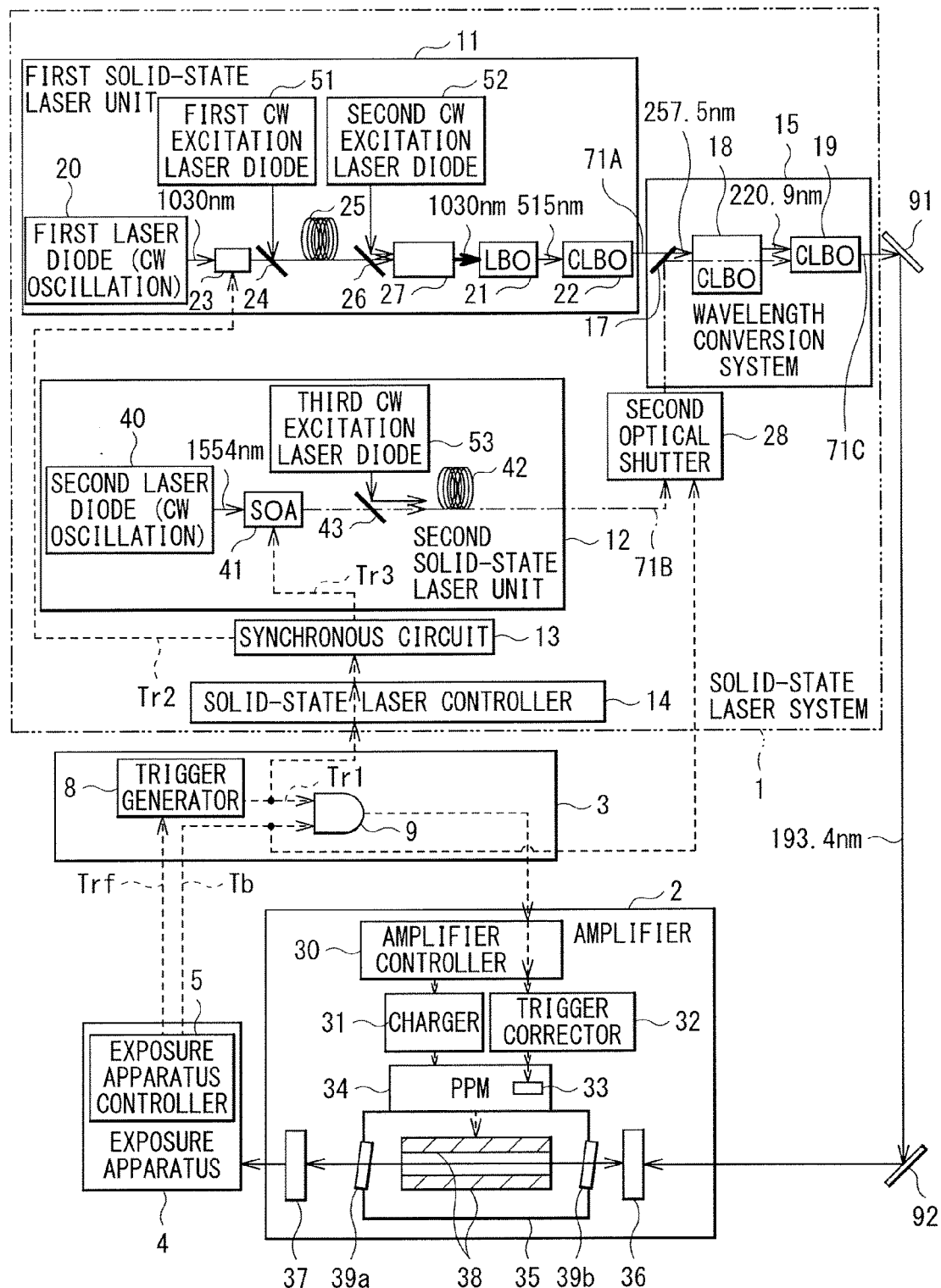
FIG. 6 schematically illustrates a configuration example of a laser apparatus that is used for an exposure apparatus and includes a solid-state laser system according to a first embodiment.

FIG. 6 schematically illustrates a configuration example of the laser apparatus that is used for the exposure apparatus and includes a solid-state laser system 1A according to the first embodiment.

The laser apparatus used for the exposure apparatus according to the present embodiment may include a burst pulse controller 3A and the solid-state laser system 1A in place of the burst pulse controller 3 and the solid-state laser system 1 in the configuration of the comparative example illustrated in FIG. 1.

The solid-state laser system 1A according to the present embodiment may further include a second optical shutter 28 in addition to the configuration of the comparative example illustrated in FIG. 1. The second optical shutter 28 may be disposed in an optical path between the second solid-state laser unit 12 and the wavelength conversion system 15. The burst signal Tb from the exposure apparatus 4 may be inputted to the second optical shutter 28 via the burst pulse controller 3A. The second optical shutter 28 may be configured so that a switching operation between shutter opening (OPEN) and shutter closing (CLOSE) is controlled in synchronization with the burst signal Tb from the exposure apparatus 4.

In the configuration of the comparative example illustrated in FIG. 1, the burst trigger signal outputted from the AND circuit 9 may be inputted to the synchronous circuit 13 via the solid-state laser controller 14. In contrast, in the present embodiment, the first trigger signal Tr1 of the predetermined repetition frequency f generated by the trigger generator 8 may be inputted to the synchronous circuit 13 via the solid-state laser controller 14.

Other configurations may be substantially similar to those of the laser apparatus used for the exposure apparatus illustrated in FIG. 1.

(3.2 Operation)

Figure 7:
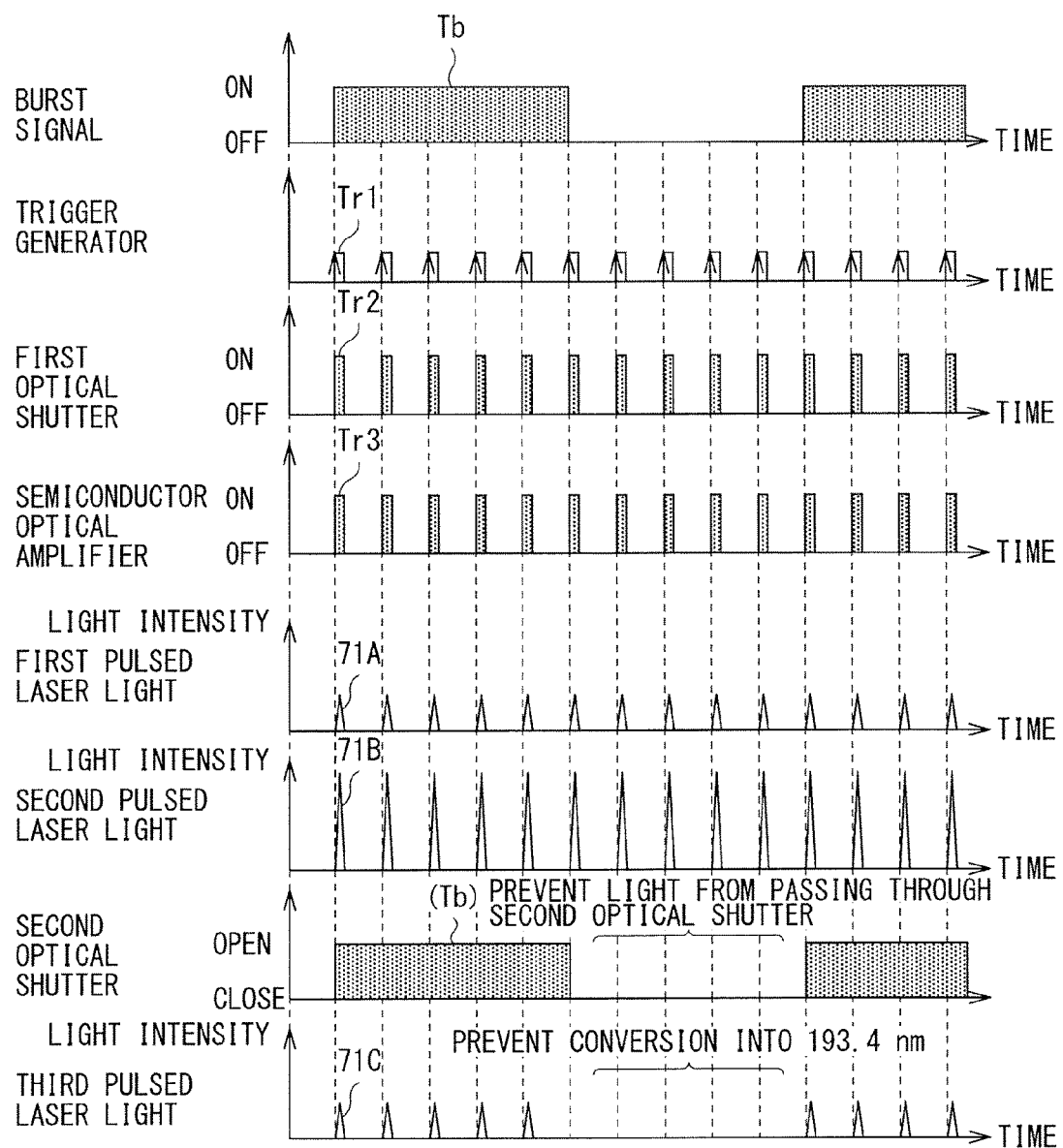
FIG. 7 is a timing chart illustrating an example of operation of the solid-state laser system illustrated in FIG. 6.

FIG. 7 is a timing chart illustrating an example of operation of the solid-state laser system 1A illustrated in FIG. 6. Respective timing charts in FIG. 7 may indicate, in order from top, a timing of outputting the burst signal Tb from the exposure apparatus 4, a timing of outputting the first trigger signal Tr1 from the trigger generator 8, a timing of on/off of the first optical shutter 23 in response to the second trigger signal Tr2, a timing of on/off of the semiconductor optical amplifier 41 in response to the third trigger signal Tr3, a timing of outputting the first pulsed laser light 71A from the first solid-state laser unit 11, a timing of outputting the second pulsed laser light 71B from the second solid-state laser unit 12, a timing of opening or closing the second optical shutter 28 in response to the burst signal Tb, and a timing of outputting the third pulsed laser light 71C from the wavelength conversion system 15.

A horizontal axis of each of the timing charts in FIG. 7 may indicate time. A vertical axis of each of the timing charts of the first pulsed laser light 71A, the second pulsed laser light 71B, and the third pulsed laser light 71C in FIG. 7 may indicate light intensity. A vertical axis of each of the other timing charts in FIG. 7 may indicate a signal value.

The synchronous circuit 13 may output the second trigger signal Tr2 to the first optical shutter 23 of the first solid-state laser unit 11 in synchronization with the first trigger signal Tr1 of the predetermined repetition frequency f generated by the trigger generator 8. Moreover, the synchronous circuit 13 may output the third trigger signal Tr3 to the semiconductor optical amplifier 41 of the second solid-state laser unit 12 in synchronization with the first trigger signal Tr1. Thus, the first solid-state laser unit 11 may continuously output the first pulsed laser light 71A at the predetermined repetition frequency f. Moreover, the second solid-state laser unit 12 may continuously output the second pulsed laser light 71B at the predetermined repetition frequency f.

In contrast, the second optical shutter 28 may operate so as to be switched to the shutter opening (OPEN) while the burst signal Tb is on and to be switched to the shutter closing (CLOSE) while the burst signal Tb is off in synchronization with the burst signal Tb inputted via the burst pulse controller 3A. As a result, in the wavelength conversion system 15, while the burst signal Tb is on, the first pulsed laser light 71A and the second pulsed laser light 71B may enter the wavelength conversion system 15 at a substantially coincidental timing to generate the third pulsed laser light 71C with a wavelength of 193.4 nm. While the burst signal Tb is off, the second optical shutter 28 may prevent the second pulsed laser light 71B from passing therethrough, thereby preventing the second pulsed laser light 71B from entering the wavelength conversion system 15. This may prevent conversion into the third pulsed laser light 71C with a wavelength of 193.4 nm while the burst signal Tb is off.

As described above, the solid-state laser system 1A may output the third pulsed laser light 71C in a burst form corresponding to the burst signal Tb of the exposure apparatus 4.

(3.3 Workings)

According to the solid-state laser system 1A of the present embodiment, the first pulsed laser light 71A and the second pulsed laser light 71B may be continuously outputted at the predetermined repetition frequency f from the first solid-state laser unit 11 and the second solid-state laser unit 12, respectively, irrespective of whether the burst signal Tb is on or off. While the burst signal Tb is on, the first pulsed laser light 71A and the second pulsed laser light 71B may enter the wavelength conversion system 15 at a substantially coincidental timing, thereby causing the wavelength conversion system 15 to output the third pulsed laser light 71C with a wavelength converted into a wavelength of 193.4 nm. While the burst signal Tb is off, the second optical shutter 28 may prevent the first pulsed laser light 71A and the second pulsed laser light 71B from entering the wavelength conversion system 15 at a coincidental timing, thereby preventing the wavelength conversion system from outputting the third pulsed laser light 71C.

As described above, the second optical shutter 28 controls entry of the second pulsed laser light 71B entering the wavelength conversion system 15 to generate a burst pulse with a wavelength of 193.4 nm, which makes it possible to achieve the following workings. An increase in energy of a burst head of the third pulsed laser light 71C with a wavelength of 193.4 nm may be suppressed. Moreover, the first solid-state laser unit 11 and the second solid-state laser unit 12 constantly output the first pulsed laser light 71A and the second pulsed laser light 71B, respectively, at the predetermined repetition frequency f. This makes it possible to suppress variation in thermal load of an optical device such as a nonlinear crystal in the apparatus. Accordingly, it is possible to suppress deterioration in characteristics of beams of the first pulsed laser light 71A and the second pulsed laser light 71B. The first pulsed laser light 71A of ultraviolet light with a wavelength of 257.5 nm outputted from the first solid-state laser unit 11 constantly enters the wavelength conversion system 15, which makes it possible to suppress variation in thermal load caused by absorption of ultraviolet light with a wavelength of 257.5 nm.

(3.4 Modification Example)

In the solid-state laser system 1A according to the first embodiment, the second optical shutter 28 may be disposed at any other position in an optical path of one of the first pulsed laser light 71A and the second pulsed laser light 71B without limiting to a position between the second solid-state laser unit 12 and the wavelength conversion system 15. For example, the second optical shutter 28 may be disposed in an optical path between the solid-state amplifier 27 and the LBO crystal 21 in the first solid-state laser unit 11 or in an optical path between the LBO crystal 21 and the CLBO crystal 22.

4. SECOND EMBODIMENT

Next, description is given of a laser apparatus that is used for an exposure apparatus and includes a solid-state laser system according to a second embodiment of the present disclosure. Note that substantially same components as the components of the laser apparatus that is used for the exposure apparatus and includes the solid-state laser system according to the foregoing comparative example or the foregoing first embodiment are denoted by same reference numerals, and redundant description thereof is omitted.

(4.1 Configuration)

Figure 8:
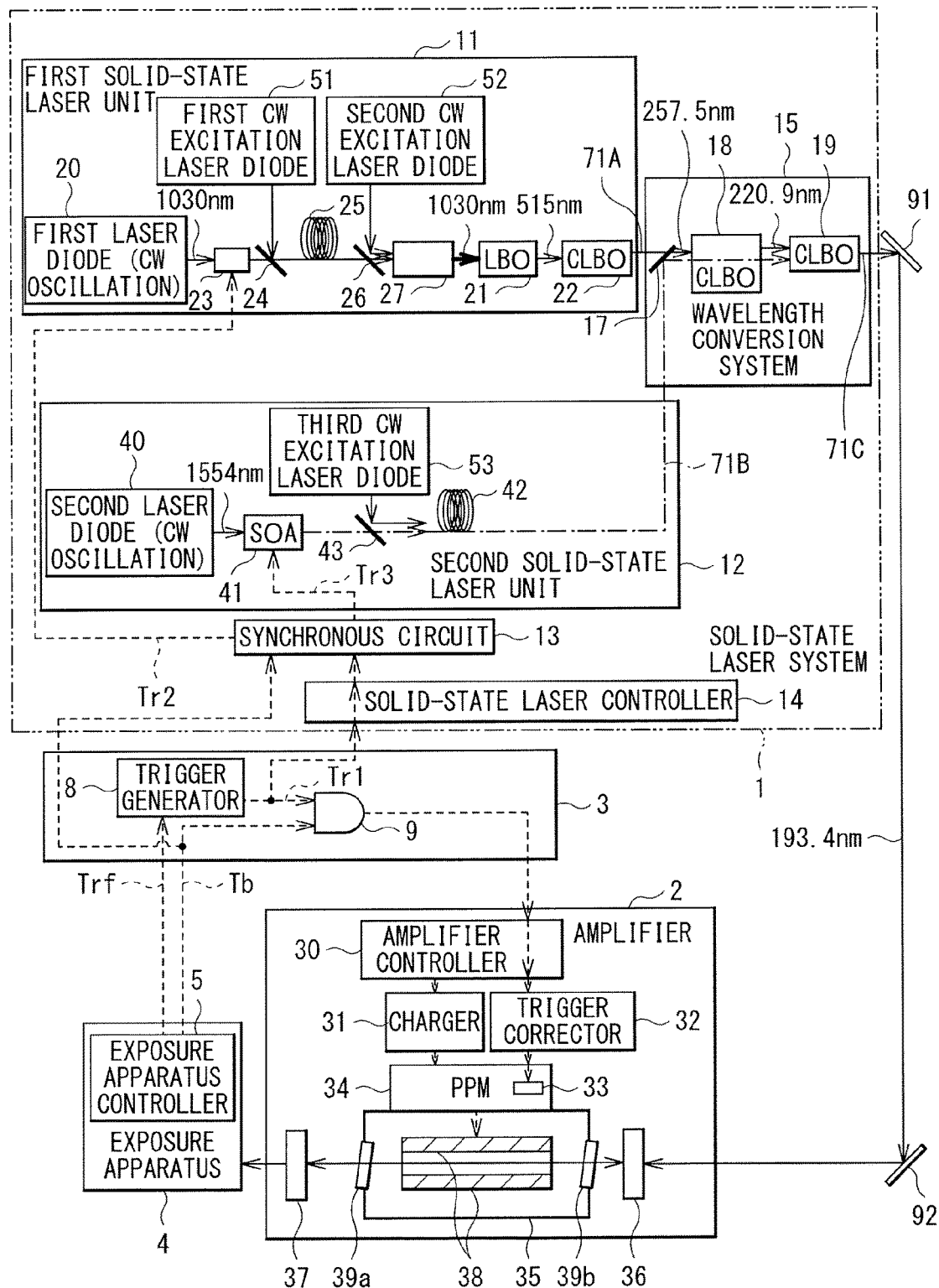
FIG. 8 schematically illustrates a configuration example of a laser apparatus that is used for an exposure apparatus and includes a solid-state laser system according to a second embodiment.

FIG. 8 schematically illustrates a configuration example of the laser apparatus that is used for the exposure apparatus and includes a solid-state laser system 1B according to the second embodiment.

The laser apparatus used for the exposure apparatus according to the present embodiment may include a burst pulse controller 3B and a solid-state laser system 1B in place of the burst pulse controller 3 and the solid-state laser system 1 in the configuration according to the comparative example illustrated in FIG. 1.

In the configuration according to the comparative example illustrated in FIG. 1, the burst trigger signal outputted from the AND circuit 9 is inputted to the synchronous circuit 13 via the solid-state laser controller 14. In contrast, in the present embodiment, the first trigger signal Tr1 of the predetermined repetition frequency f generated by the trigger generator 8 may be inputted to the synchronous circuit 13B via the solid-state laser controller 14. Moreover, in the present embodiment, the burst signal Tb from the exposure apparatus 4 may be inputted to the synchronous circuit 13B not through the solid-state laser controller 14.

The synchronous circuit 13B may output the second trigger signal Tr2 and the third trigger signal Tr3 that cause the first pulsed laser light 71A and the second pulsed laser light 71B to enter the wavelength conversion system 15 at a substantially coincidental timing while the burst signal Tb is on. Moreover, the synchronous circuit 13B may output the second trigger signal Tr2 and the third trigger signal Tr3 that cause the first pulsed laser light 71A and the second pulsed laser light 71B to enter the wavelength conversion system 15 at different timings from each other while the burst signal Tb is off.

Other configurations may be substantially similar to those of the laser apparatus used for the exposure apparatus illustrated in FIG. 1.

(4.2 Operation)

Figure 9:
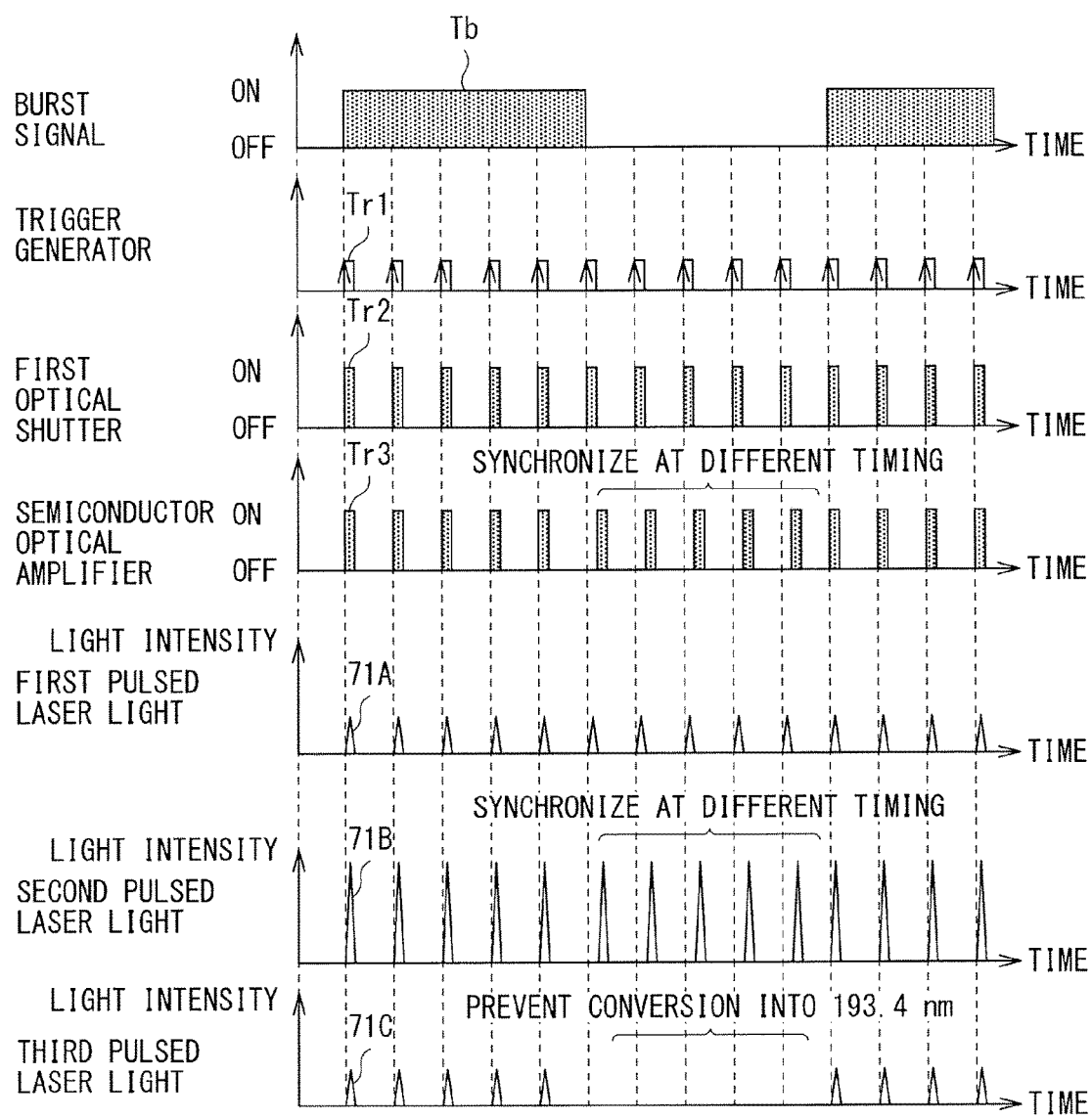
FIG. 9 is a timing chart illustrating an example of operation of the solid-state laser system illustrated in FIG. 8.

FIG. 9 is a timing chart illustrating an example of operation of the solid-state laser system 1B illustrated in FIG. 8. Respective timing charts in FIG. 9 may indicate, in order from top, a timing of outputting the burst signal Tb from the exposure apparatus 4, a timing of outputting the first trigger signal Tr1 from the trigger generator 8, a timing of on/off of the first optical shutter 23 in response to the second trigger signal Tr2, a timing of on/off of the semiconductor optical amplifier 41 in response to the third trigger signal Tr3, a timing of outputting the first pulsed laser light 71A from the first solid-state laser unit 11, a timing of outputting the second pulsed laser light 71B from the second solid-state laser unit 12, and a timing of outputting the third pulsed laser light 71C from the wavelength conversion system 15.

A horizontal axis in each of the timing charts in FIG. 9 may indicate time. A vertical axis of each of the timing charts of the first pulsed laser light 71A, the second pulsed laser light 71B, and the third pulsed laser light 71C in FIG. 9 may indicate light intensity. A vertical axis in each of the other timing charts in FIG. 9 may indicate a signal value.

The solid-state laser controller 14 may control the synchronous circuit 13B so as to cause the first pulsed laser light 71A and the second pulsed laser light 71B to enter the wavelength conversion system 15 at a substantially coincidental timing while the burst signal Tb is on. For example, the second trigger signal Tr2 and the third trigger signal Tr3 to be outputted from the synchronous circuit 13B may synchronize with each other, as illustrated in FIG. 9. Accordingly, while the burst signal Tb is on, the first pulsed laser light 71A and the second pulsed laser light 71B may enter the wavelength conversion system 15 at a substantially coincidental timing. Thus, the wavelength conversion system 15 may output the third pulsed laser light 71C with a wavelength converted into a wavelength of 193.4 nm.

Moreover, the solid-state laser controller 14 may control the synchronous circuit 13B so as to cause the first pulsed laser light 71A and the second pulsed laser light 71B to be synchronized at different timings from each other while the burst signal Tb is off. Accordingly, the first pulsed laser light 71A and the second pulsed laser light 71B may enter the wavelength conversion system 15 at different timings from each other. For example, the third trigger signal Tr3 may be synchronized at a different timing from a timing of synchronizing the second trigger signal Tr2, as illustrated in FIG. 9. Accordingly, while the burst signal Tb is off, the first pulsed laser light 71A and the second pulsed laser light 71B enter the wavelength conversion system 15 at different timings from each other. This may prevent wavelength conversion into a wavelength of 193.4 nm in the wavelength conversion system 15.

As described above, the solid-state laser system 1B may output the third pulsed laser light 71C in a burst form corresponding to the burst signal Tb of the exposure apparatus 4.

It is to be noted that in the timing charts in FIG. 9, the third trigger signal Tr3 is synchronized at a different timing from a timing of synchronizing the second trigger signal Tr2 to cause the second pulsed laser light 71B to be synchronized at a different timing; however, the first pulsed laser light 71A may be synchronized at a different timing. Moreover, the timings of synchronizing the second trigger signal Tr2 and the third trigger signal Tr3 while the burst signal Tb is off may be different from the timings of synchronizing the second trigger signal Tr2 and the third trigger signal Tr3 while the burst signal Tb is on, thereby causing the first pulsed laser light 71A and the second pulsed laser light 71B to be synchronized at different timings from each other.

To give a specific example, a rising edge of a pulse of the first pulsed laser light 71A may be shifted slightly, e.g. by 100 ns only while the burst signal Tb is off. As a result, the first pulsed laser light 71A and the second pulsed laser light 71B may be prevented from entering the wavelength conversion system 15 at a coincidental timing, thereby preventing generation of a sum frequency. For example, in a case in which the repetition frequency of the trigger generator 8 is 6 kHz, a pulse interval is 167 μs. Accordingly, even though synchronization is shifted by about 100 ns, a shift of the timing of outputting the first pulsed laser light 71A is small, which makes it possible to suppress an influence of the burst operation.

Figure 17:
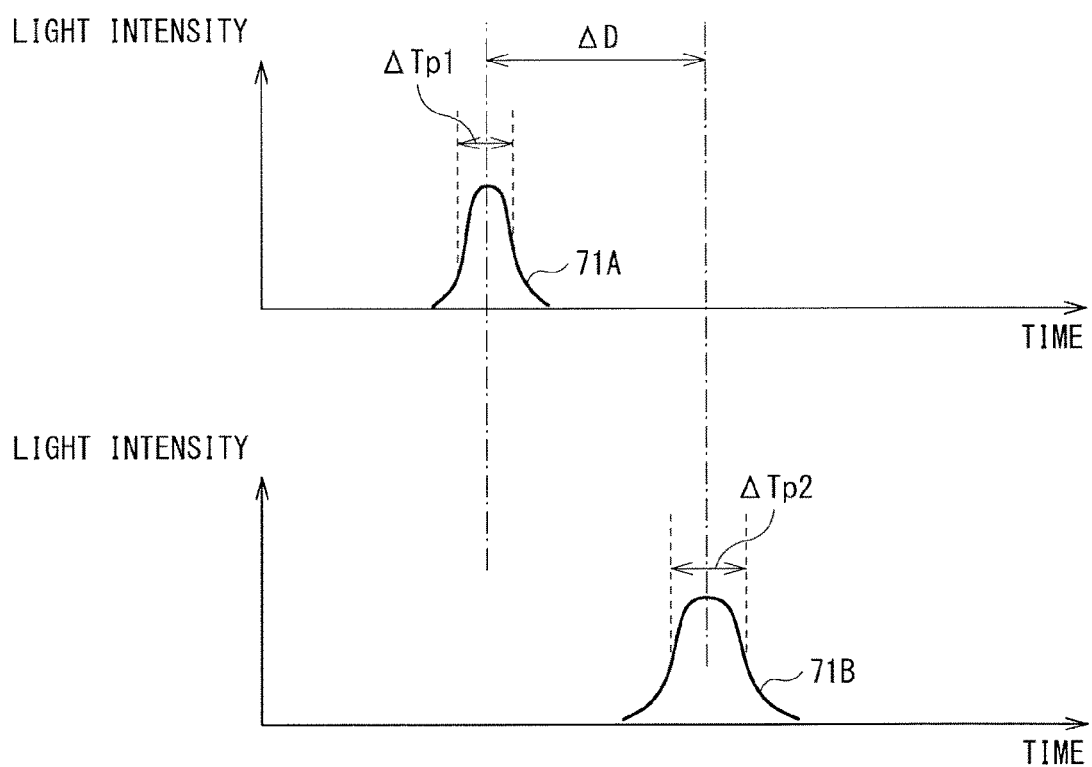
FIG. 17 schematically illustrates an example of timings of first pulsed laser light and second pulsed laser light entering a wavelength conversion system while the burst signal is off.

FIG. 17 schematically illustrates an example of timings of the first pulsed laser light 71A and second pulsed laser light 71B entering the wavelength conversion system 15 while the burst signal Tb is off.

In FIG. 17, an upper part illustrates an example of the first pulsed laser light 71A entering the wavelength conversion system 15, and a lower part illustrates an example of the second pulsed laser light 71B entering the wavelength conversion system 15. Moreover, in FIG. 17, $\Delta Tp1$ indicates a pulse width of the first pulsed laser light 71A entering the wavelength conversion system 15, and $\Delta Tp2$ indicates a pulse width of the second pulsed laser light 71B entering the wavelength conversion system 15. The pulse width $\Delta Tp1$ and the pulse width $\Delta Tp2$ each may be a full width at half maximum, for example. $\Delta D$ indicates a time difference between the timing of the first pulsed laser light 71A entering the wavelength conversion system 15 and the timing of the second pulsed laser light 71B entering the wavelength conversion system 15.

While the burst signal Tb is off, the first pulsed laser light 71A and the second pulsed laser light 71B may enter the wavelength conversion system 15 at different timings from each other, and a difference between the different timings may be equal to or greater than a sum of the pulse width $\Delta Tp1$ of the first pulsed laser light 71A and the pulse width $\Delta Tp2$ of the second pulsed laser light 71B.

In other words, the time difference $\Delta D$ between the timing of the first pulsed laser light 71A entering the wavelength conversion system 15 and the timing of the second pulsed laser light 71B entering the wavelength conversion system 15 may be changed so as to satisfy the following expression (1).

$$|\Delta D| \geq \Delta Tp1 + \Delta Tp2 \tag{1}$$

(4.3 Workings)

According to the solid-state laser system 1B of the present embodiment, the first solid-state laser unit 11 and the second solid-state laser unit 12 may continuously output the first pulsed laser light 71A and the second pulsed laser light 71B, respectively, irrespective of whether the burst signal Tb is on or off. While the burst signal Tb is on, the first pulsed laser light 71A and the second pulsed laser light 71B may enter the wavelength conversion system 15 at a substantially coincidental timing, thereby causing the wavelength conversion system 15 to output the third pulsed laser light 71C with a wavelength converted into a wavelength of 193.4 nm. While the burst signal Tb is off, the first pulsed laser light 71A and the second pulsed laser light 71B are prevented from entering the wavelength conversion system 15 at a coincidental timing, thereby preventing the third pulsed laser light 71C from being outputted. Even if the burst signal Tb is off, the first pulsed laser light 71A and the second pulsed laser light 71B may enter the wavelength conversion system 15 at different timings from each other. Thus, as compared with the foregoing first embodiment, variation in thermal load of the wavelength conversions system 15 may be further suppressed.

5. THIRD EMBODIMENT

Next, description is given of a laser apparatus that is used for an exposure apparatus and includes a solid-state laser system according to a third embodiment of the present disclosure. Note that substantially same components as the components of the laser apparatus that is used for the exposure apparatus and includes the solid-state laser system according to the foregoing comparative example or the foregoing first or second embodiment are denoted by same reference numerals, and redundant description thereof is omitted.

(5.1 Configuration)

Figure 10:
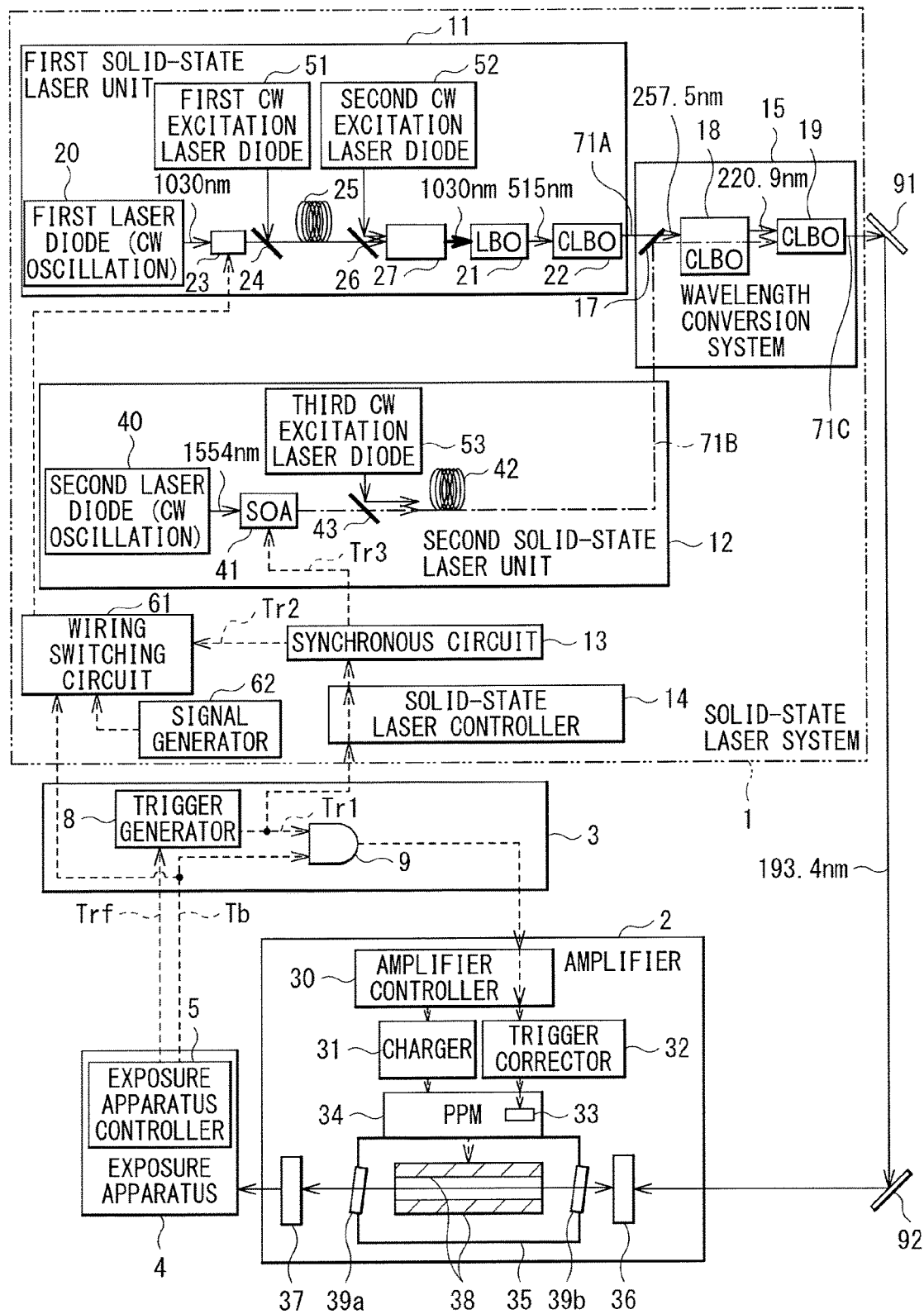
FIG. 10 schematically illustrates a configuration example of a laser apparatus that is used for an exposure apparatus and includes a solid-state laser system according to a third embodiment.

FIG. 10 schematically illustrates a configuration example of the laser apparatus that is used for the exposure apparatus and includes a solid-state laser system 1C according to the third embodiment.

The laser apparatus used for the exposure apparatus according to the present embodiment may include a burst pulse controller 3C and the solid-state laser system 1C in place of the burst pulse controller 3 and the solid-state laser system 1 in the configuration according to the comparative example illustrated in FIG. 1.

The solid-state laser system 1C according to the present embodiment may further include a wiring switching circuit 61 and a signal generator 62 in addition to the configuration according to the comparative example illustrated in FIG. 1.

In the configuration according to the comparative example illustrated in FIG. 1, the burst trigger signal outputted from the AND circuit 9 may be inputted to the synchronous circuit 13 via the solid-state laser controller 14. In contrast, in the present embodiment, the first trigger signal Tr1 of the predetermined repetition frequency f generated by the trigger generator 8 may be inputted to the synchronous circuit 13 via the solid-state laser controller 14. Moreover, in the present embodiment, the burst signal Tb from the exposure apparatus 4 may be inputted to the AND circuit 9 and the wiring switching circuit 61.

The signal generator 62 may be a circuit generating a control signal that controls operation of the first optical shutter 23 in a period in which the burst signal Tb is off. The signal generator 62 may output the generated control signal to the wiring switching circuit 61. The signal generator 62 may output a fixed low voltage as a first example of the control signal. Moreover, the signal generator 62 may be a circuit generating, as a second example of the control signal, a pulse signal of a repetition frequency that is higher than the predetermined repetition frequency f generated by the trigger generator 8. For example, the predetermined repetition frequency f generated by the trigger generator 8 may be 6 kHz. The signal generator 62 may generate, for example, a pulse signal of 10 kHz to 100 kHz that is higher than 6 kHz.

While the burst signal Tb is on, the wiring switching circuit 61 may output the second trigger signal Tr2 from the synchronous circuit 13 toward the first optical shutter 23. While the burst signal Tb is off, the wiring switching circuit 61 may output the control signal from the signal generator 62 toward the first optical shutter 23. The wiring switching circuit 61 may be configured of an analog switch, for example.

In the present embodiment, the first optical shutter 23 may be a light intensity varying section that varies light intensity of the first pulsed laser light 71A.

Other configurations may be substantially similar to those in the laser apparatus used for the exposure apparatus illustrated in FIG. 1.

(5.2 Operation)

Figure 11:
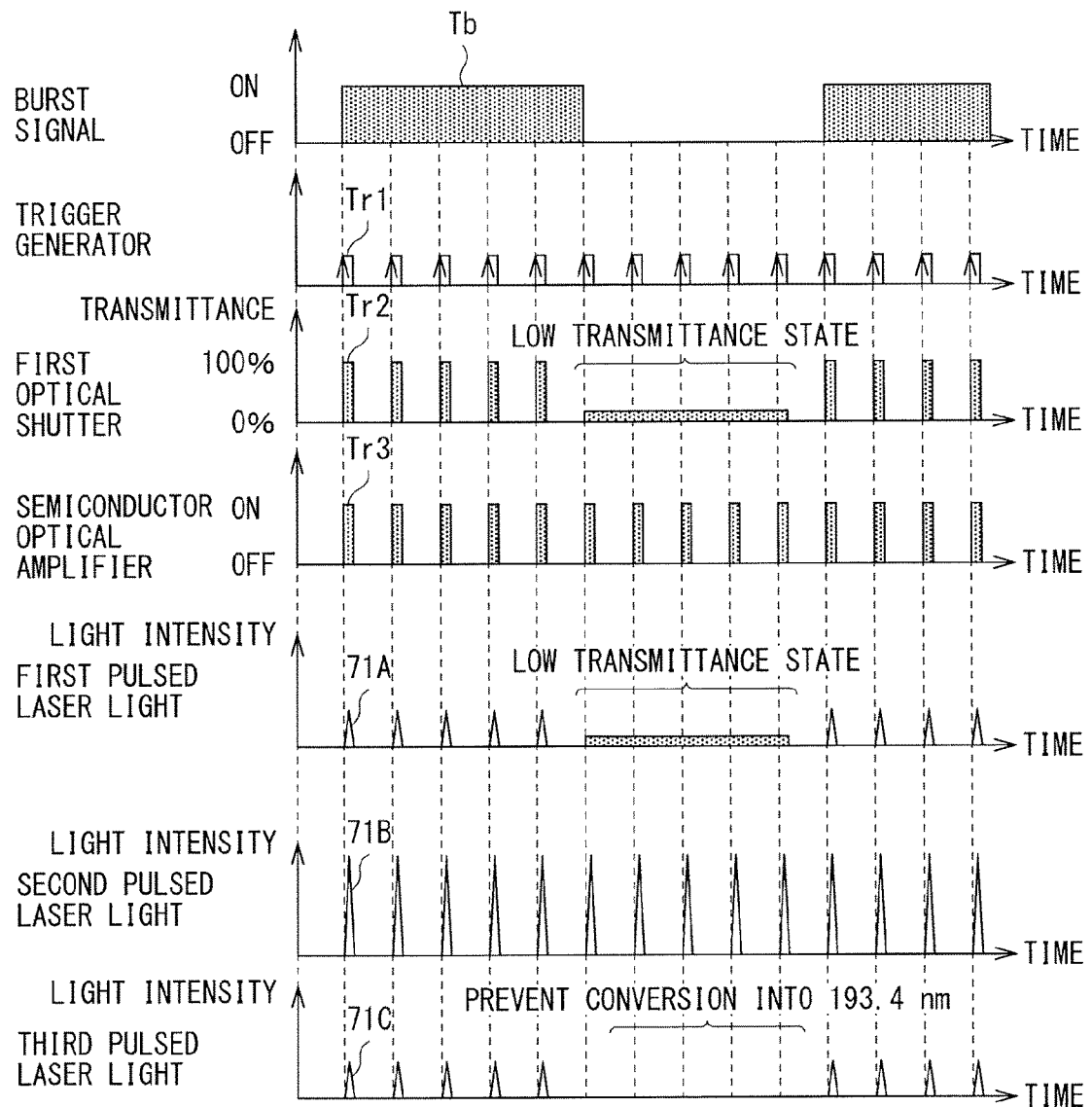
FIG. 11 is a timing chart illustrating an example of operation of the solid-state laser system illustrated in FIG. 10.
Figure 12:
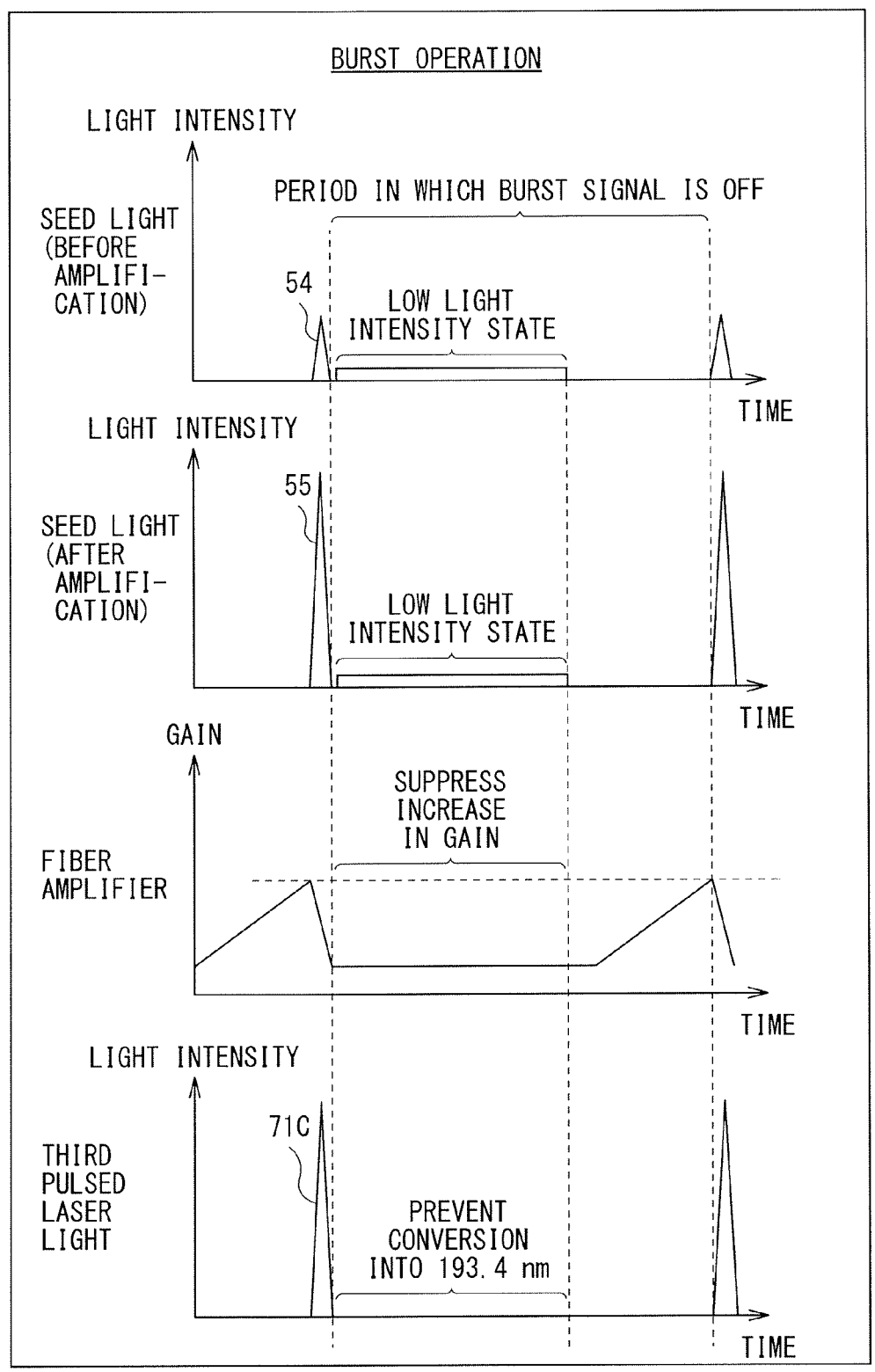
FIG. 12 is a timing chart illustrating a first operation example in a period in which a burst signal in the solid-state laser system illustrated in FIG. 10 is off.

FIGS. 11 and 12 each are a timing chart illustrating an example of operation of the solid-state laser system 1C illustrated in FIG. 10. Respective timing charts in FIG. 11 may indicate, in order from top, a timing of outputting the burst signal Tb from the exposure apparatus 4, a timing of outputting the first trigger signal Tr1 from the trigger generator 8, a timing of varying transmittance of the first optical shutter 23 in response to the second trigger signal Tr2 or the control signal generated by the signal generator 62, a timing of on/off of the semiconductor optical amplifier 41 in response to the third trigger signal Tr3, a timing of outputting the first pulsed laser light 71A from the first solid-state laser unit 11, a timing of outputting the second pulsed laser light 71B from the second solid-state laser unit 12, and a timing of outputting the third pulsed laser light 71C from the wavelength conversion system 15.

A horizontal axis of each of the timing charts in FIG. 11 may indicate time. A vertical axis of each of the timing charts of the first pulsed laser light 71A, the second pulsed laser light 71B, and the third pulsed laser light 71C in FIG. 11 may indicate light intensity. A vertical axis of each of the other timing charts in FIG. 7 may indicate a signal value.

Respective timing charts in FIG. 12 may indicate, in order from top, a timing indicating variation in light intensity of the seed light 54 before being amplified by the first fiber amplifier 25, a timing indicating variation in light intensity of the seed light 55 having been amplified by the first fiber amplifier 25, a timing of indicating variation in gain of the first fiber amplifier 25, and a timing of outputting the third pulsed laser light 71C from the wavelength conversion system 15.

A horizontal axis of each of the timing charts in FIG. 12 may indicate time. A vertical axis of each of the timing charts of the seed light 54 before being amplified, the seed light 55 having been amplified, and the third pulsed laser light 71C in FIG. 12 may indicate light intensity. A vertical axis of the timing chart of the first fiber amplifier 25 in FIG. 12 may indicate gain.

The synchronous circuit 13 may output the second trigger signal Tr2 to the wiring switching circuit 61 in synchronization with the first trigger signal Tr1 of the predetermined repetition frequency f generated by the trigger generator 8. Moreover, the synchronous circuit 13 may output the third trigger signal Tr3 to the semiconductor optical amplifier 41 of the second solid-state laser unit 12 in synchronization with the first trigger signal Tr1. The signal generator 62 may output, to the wiring switching circuit 61, the control signal that controls the operation of the first optical shutter 23 in the period in which the burst signal Tb is off.

The wiring switching circuit 61 may output the second trigger signal Tr2 generated by the synchronous circuit 13 to the first optical shutter 23 while the burst signal Tb is on. As a result, while the burst signal Tb is on, the first pulsed laser light 71A and the second pulsed laser light 71B may enter the wavelength conversion system 15 at a substantially coincidental timing and at light intensity allowing for wavelength conversion, thereby generating the third pulsed laser light 71C with a wavelength of 193.4 nm.

While the burst signal Tb is off, the wiring switching circuit 61 may output the control signal generated by the signal generator 62 to the first optical shutter 23. A fixed low voltage as the control signal from the signal generator 62 may be outputted to control the transmittance of the first optical shutter 23 to a fixed low level. Accordingly, while the burst signal Tb is off, the CW-oscillated seed light 54 from the first laser diode 20 may be outputted at low light intensity in the CW mode via the first optical shutter 23. Thus, the first pulsed laser light 71A with a wavelength of 257.5 nm may be outputted at low light intensity from the first solid-state laser unit 11. At this occasion, in the wavelength conversion system 15, wavelength conversion efficiency is determined by a peak value of the light intensity; therefore, while the burst signal Tb is off, wavelength conversion into a wavelength of 193.4 nm by the sum frequency of the first pulsed laser light 71A and the second pulsed laser light 71B may be prevented.

In the comparative example in FIG. 1, when the seed light 54 is inputted to the first fiber amplifier 25 by the burst operation, balance of the gain of the first fiber amplifier 25 may be lost by change in the timing of inputting the seed light 54, as illustrated in FIG. 5. As a result, the light intensity of the seed light 55 having been amplified may vary. In particular, the light intensity of the head pulse of the burst may become high. In contrast, in the solid-state laser system 1C according to the present embodiment, the seed light 54 may be inputted at low light intensity to the first fiber amplifier 25 in the period in which the burst signal Tb is off, as illustrated in FIG. 12. Accordingly, in the period in which the burst signal Tb is off, an increase in gain of the first fiber amplifier 25 may be suppressed, and a state in which the gain is low may be maintained. This makes it possible to suppress an increase in light intensity of the head pulse of the burst.

It is to be noted that a time period in which the light intensity of the seed light 54 is turned to a fixed low level may be appropriately adjusted in accordance with a rising gradient of the gain of the first fiber amplifier 25 so as to cause the gain to reach an optimal value when the burst signal Tb is next turned on. For example, in the period in which the burst signal Tb is off, the light intensity of the seed light 54 may be adjusted to the fixed low level in a substantially first half of the period, and may be adjusted close to almost zero in the following remaining period. It is to be noted that in the first solid-state laser unit 11, when the peak value of the light intensity of the seed light does not reach a wavelength conversion threshold value in the LBO crystal 21 and CLBO crystal 22, the first pulsed laser light 71A may be prevented from being outputted from the first solid-state laser unit 11.

Figure 13:
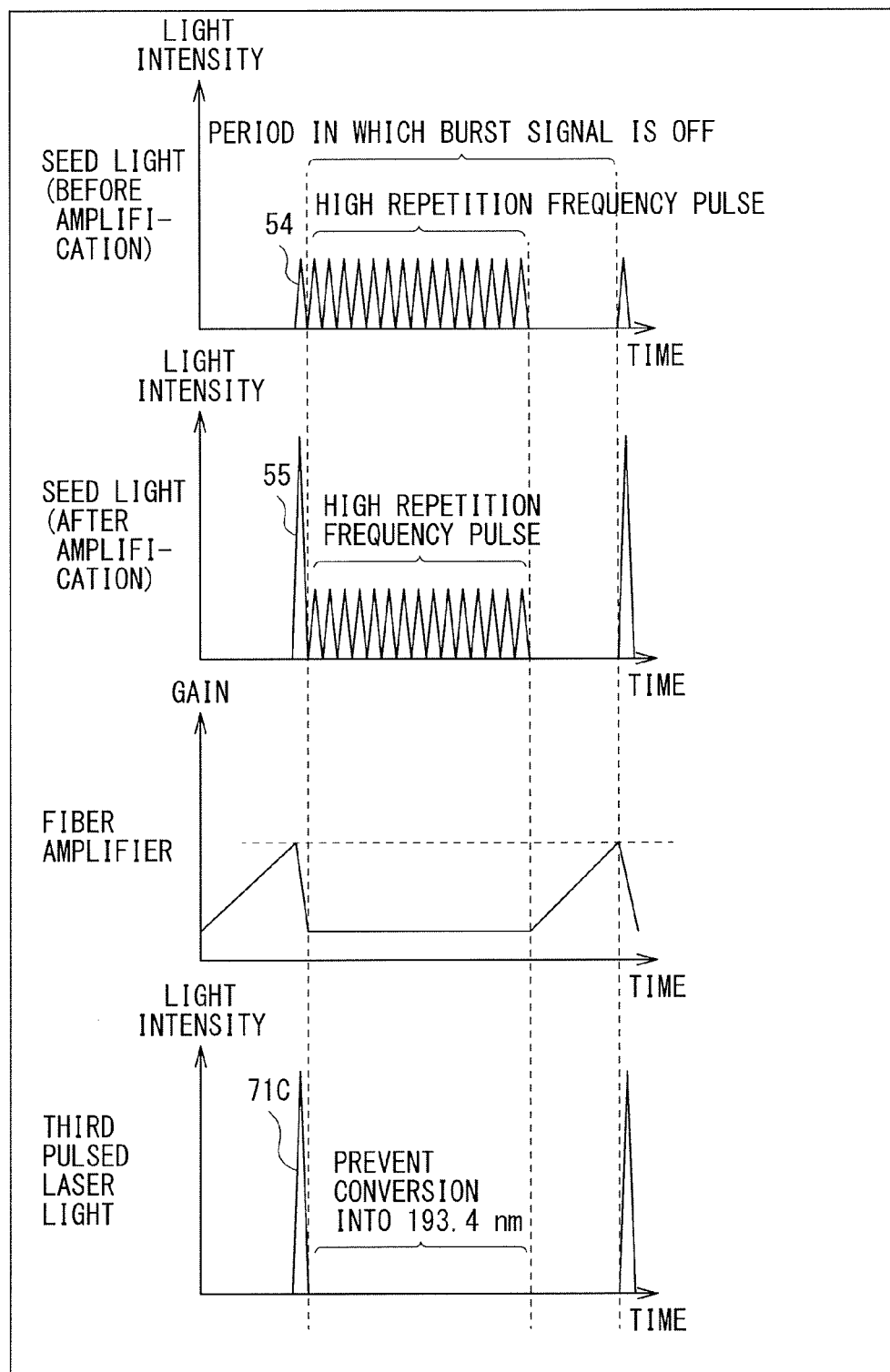
FIG. 13 is a timing chart illustrating a second operation example in a period in which the burst signal in the solid-state laser system illustrated in FIG. 10 is off.

Next, FIG. 13 illustrates an example of a timing chart in a case in which the signal generator 62 outputs, as the control signal, a pulse signal of a repetition frequency that is higher than the predetermined repetition frequency f generated by the trigger generator 8.

Respective timing charts in FIG. 13 may indicate, in order from top, a timing indicating change in the light intensity of the seed light 54 before being amplified by the first fiber amplifier 25, a timing indicating change in the light intensity of the seed light 55 having been amplified by the first fiber amplifier 25, a timing indicating change in gain of the first fiber amplifier 25, and a timing of outputting the third pulsed laser light 71C.

A horizontal axis in the respective timing charts in FIG. 13 may indicate time. A vertical axis in each of the timing charts of the seed light 54 before being amplified, the seed light 55 having been amplified, and the third pulsed laser light 71C in FIG. 13 may indicate light intensity. A vertical axis of the timing chart of the first fiber amplifier 25 in FIG. 13 may indicate gain.

While the burst signal Tb is off, the first optical shutter 23 may be controlled so as to allow the seed light 54 to pass therethrough at a repetition frequency higher than the predetermined repetition frequency f generated by the trigger generator 8, as illustrated in FIG. 13. When the seed light 54 is inputted at a high repetition frequency to the first fiber amplifier 25, an increase in gain of the first fiber amplifier 25 may be suppressed. Accordingly, in the period in which the burst signal Tb is off, the peak value of the light intensity of the seed light 55 having been amplified by the first fiber amplifier 25 may become low. Thus, in the period in which the burst signal Tb is off, the first pulsed laser light 71A with a wavelength of 257.5 nm may be outputted at low light intensity from the first solid-state laser unit 11. As a result, in the period in which the burst signal Tb is off, wavelength conversion into a wavelength of 193.4 nm may be prevented in the wavelength conversion system 15.

It is to be noted that a time period in which the repetition frequency is turned to the high repetition frequency mentioned above may be appropriately adjusted in accordance with a rising gradient of the gain of the first fiber amplifier 25 so as to cause the gain to reach an optimal value when the burst signal Tb is next turned on. For example, in the period in which the burst signal Tb is off, the repetition frequency may be adjusted to the fixed high repetition frequency in a substantially first half of the period, and may be adjusted so as to prevent the seed light 55 from being outputted in the following remaining period, as illustrated in FIG. 13.

(5.3 Workings)

According to the solid-state laser system 1C of the present embodiment, while the burst signal Tb is off, the light intensity of the first pulsed laser light 71A may be controlled so as to prevent wavelength conversion in the wavelength conversion system 15 and prevent outputting of the third pulsed laser light 71C. While the burst signal Tb is on, the light intensity of the first pulsed laser light 71A and the light intensity of the second pulsed laser light 71B may be controlled so as to cause the wavelength conversion system 15 to output the third pulsed laser light 71C with the third wavelength converted from the first wavelength and the second wavelength. While the burst signal Tb is off, the light intensity of the seed light may be suppressed in the first solid-state laser unit 11 so as to become equal to or lower than the wavelength conversion threshold value in the wavelength conversion system 15, which may decrease the gain of the first fiber amplifier 25 and the gain of the solid-state amplifier 27. This makes it possible to suppress an increase in the light intensity of the head pulse of the burst.

6. FOURTH EMBODIMENT

Next, description is given of a laser apparatus that is used for an exposure apparatus and includes a solid-state laser system according to a fourth embodiment of the present disclosure. Note that substantially same components as the components of the laser apparatus that is used for the exposure apparatus and includes the solid-state laser system according to the foregoing comparative example or any of the foregoing first to third embodiments are denoted by same reference numerals, and redundant description thereof is omitted.

(6.1 Configuration)

Figure 14:
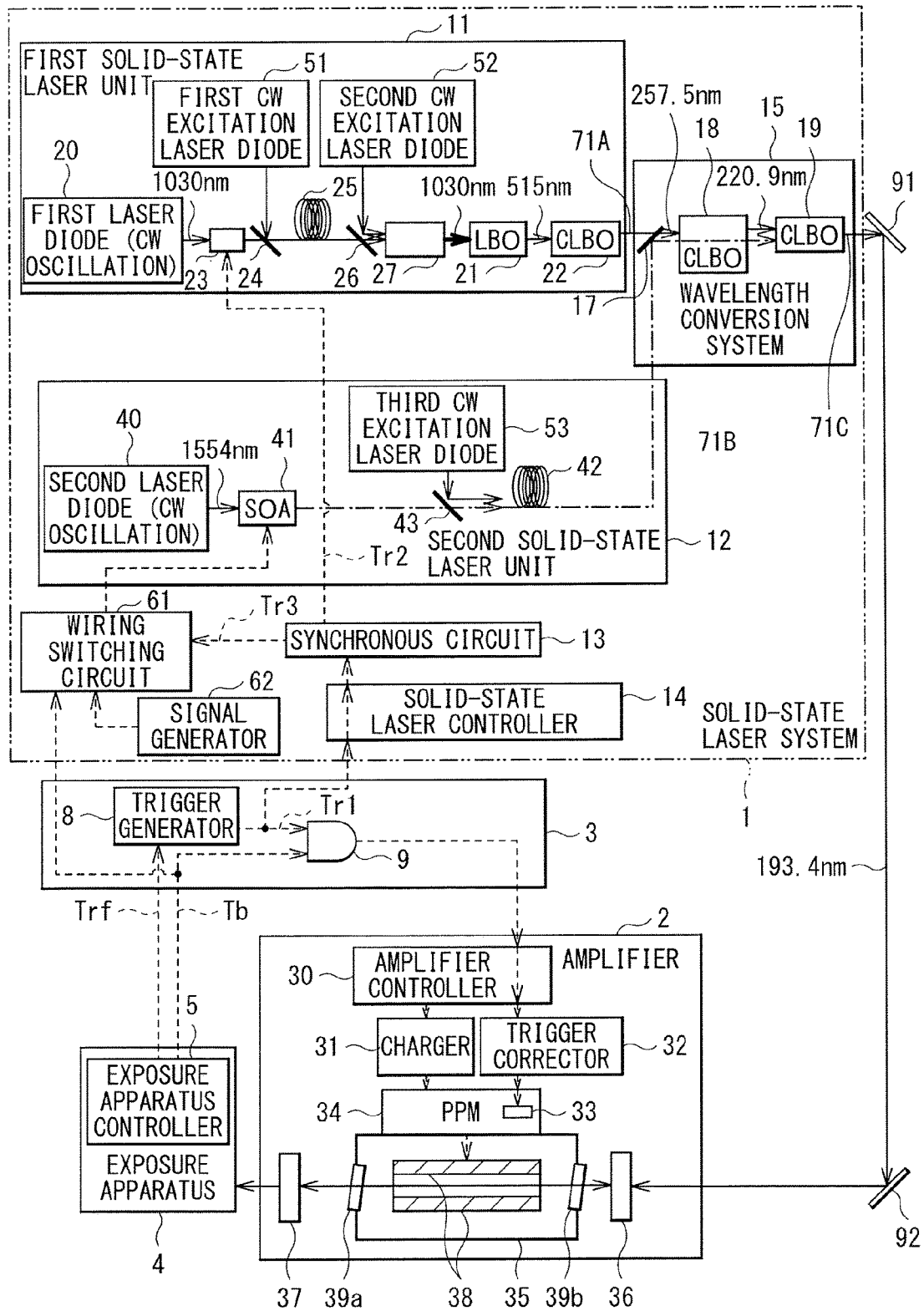
FIG. 14 schematically illustrates a configuration example of a laser apparatus that is used for an exposure apparatus and includes a solid-state laser system according to a fourth embodiment.

FIG. 14 schematically illustrates a configuration example of the laser apparatus that is used for the exposure apparatus and includes a solid-state laser system 1D according to the fourth embodiment.

The laser apparatus used for the exposure apparatus according to the present embodiment may include a burst pulse controller 3D and the solid-state laser system 1D in place of the burst pulse controller 3 and the solid-state laser system 1 in the configuration according to the comparative example illustrated in FIG. 1.

The solid-state laser system 1D according to the present embodiment may further include the wiring switching circuit 61 and the signal generator 62 in addition to the configuration according to the comparative example illustrated in FIG. 1.

In the configuration according to the comparative example illustrated in FIG. 1, the burst trigger signal outputted from the AND circuit 9 may be inputted to the synchronous circuit 13 via the solid-state laser controller 14. In contrast, in the present embodiment, the first trigger signal Tr1 of the predetermined repetition frequency f generated by the trigger generator 8 may be inputted to the synchronous circuit 13 via the solid-state laser controller 14. Moreover, in the present embodiment, the burst signal Tb from the exposure apparatus 4 may be inputted to the AND circuit 9 and the wiring switching circuit 61.

The signal generator 62 may be a circuit generating a control signal that controls operation of the semiconductor optical amplifier 41 in the period in which the burst signal Tb is off. The signal generator 62 may output the generated control signal to the wiring switching circuit 61. The signal generator 62 may output a fixed low current as a first example of the control signal. Moreover, the signal generator 62 may outputs, as a second example of the control signal, a pulsed current of a repetition frequency that is higher than the predetermined repetition frequency f generated by the trigger generator 8. For example, the predetermined repetition frequency f generated by the trigger generator 8 may be 6 kHz. The signal generator 62 may generate, for example, a pulsed current of 10 kHz to 100 kHz that is higher than 6 kHz.

While the burst signal Tb is on, the wiring switching circuit 61 may output the third trigger signal Tr3 from the synchronous circuit 13 toward the semiconductor optical amplifier 41. While the burst signal Tb is off, the wiring switching circuit 61 may output the control signal from the signal generator 62 toward the semiconductor optical amplifier 41. The wiring switching circuit 61 may be configured of an analog switch, for example.

In the present embodiment, the semiconductor optical amplifier 41 may be a light intensity varying section that varies the light intensity of the second pulsed laser light 71B.

Other configurations may be substantially similar to those in the laser apparatus used for the exposure apparatus illustrated in FIG. 1.

(6.2 Operation)

Figure 15:
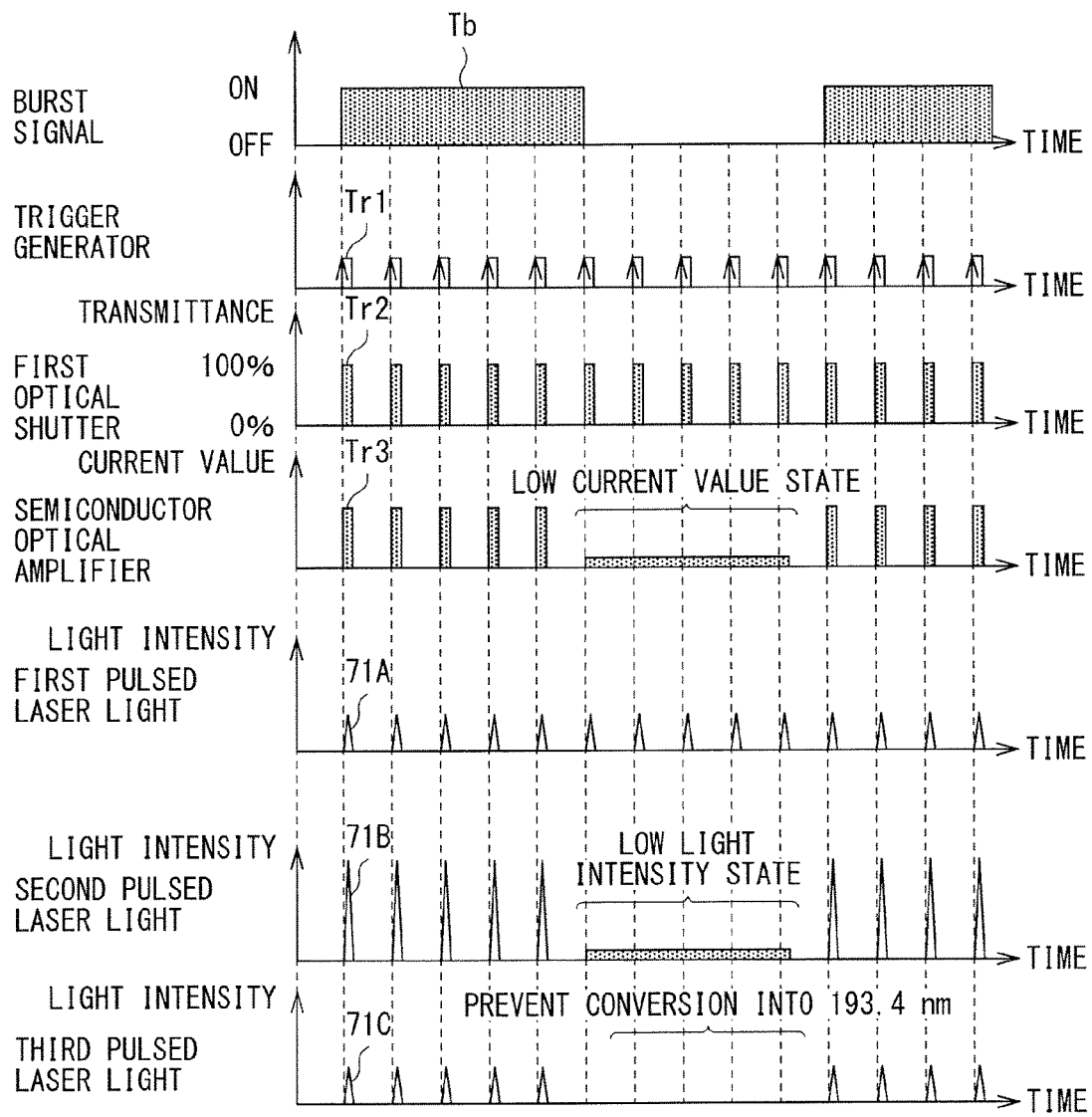
FIG. 15 is a timing chart illustrating an example of operation of the solid-state laser system illustrated in FIG. 14.

FIG. 15 is a timing chart illustrating an example of operation of the solid-state laser system 1D illustrated in FIG. 14. Respective timing charts in FIG. 15 may indicate, in order from top, a timing of outputting the burst signal Tb from the exposure apparatus 4, a timing of outputting the first trigger signal Tr1 from the trigger generator 8, a timing of change in transmittance of the first optical shutter 23 in response to the second trigger signal Tr2, a timing of change in a current value of the semiconductor optical amplifier 41 in response to the third trigger signal Tr3 or the control signal generated by the signal generator 62, a timing of outputting the first pulsed laser light 71A from the first solid-state laser unit 11, a timing of outputting the second pulsed laser light 71B from the second solid-state laser unit 12, and a timing of outputting the third pulsed laser light 71C from the wavelength conversion system 15.

A horizontal axis in each of the timing charts in FIG. 15 may indicate time. A vertical axis of each of the timing charts of the first pulsed laser light 71A, the second pulsed laser light 71B, and the third pulsed laser light 71C may indicate light intensity. A vertical axis of each of the other timing charts in FIG. 15 may indicate a signal value or a current value.

The synchronous circuit 13 may output the second trigger signal Tr2 to the wiring switching circuit 61 in synchronization with the first trigger signal Tr1 of the predetermined repetition frequency f generated by the trigger generator 8. Moreover, the synchronous circuit 13 may output the third trigger signal Tr3 to the semiconductor optical amplifier 41 of the second solid-state laser unit 12 in synchronization with the first trigger signal Tr1. The signal generator 62 may output, to the wiring switching circuit 61, the control signal that controls the operation of the semiconductor optical amplifier 41 in the period in which the burst signal Tb is off.

The wiring switching circuit 61 may output the third trigger signal Tr3 generated by the synchronous circuit 13 to the semiconductor optical amplifier 41 while the burst signal Tb is on. As a result, while the burst signal Tb is on, the first pulsed laser light 71A and the second pulsed laser light 71B may enter the wavelength conversion system 15 at a substantially coincidental timing and at light intensity allowing for wavelength conversion, thereby generating the third pulsed laser light 71C with a wavelength of 193.4 nm.

While the burst signal Tb is off, the wiring switching circuit 61 may output the control signal generated by the signal generator 62 to the semiconductor optical amplifier 41. A fixed low current as the control signal from the signal generator 62 may be outputted to control a current to be applied to the semiconductor optical amplifier 41 to a fixed low current value, thereby decreasing an amplification factor of the semiconductor optical amplifier 41. Accordingly, while the burst signal Tb is off, CW-oscillated seed light from the second laser diode 40 may be outputted at low light intensity in the CW mode via the semiconductor optical amplifier 41. Thus, the second pulsed laser light 71B may be outputted at low light intensity from the second solid-state laser unit 12. At this occasion, in the wavelength conversion system 15, wavelength conversion efficiency is determined by the peak value of the light intensity; therefore, while the burst signal Tb is off, wavelength conversion into a wavelength of 193.4 nm by the sum frequency of the first pulsed laser light 71A and the second pulsed laser light 71B may be prevented.

Moreover, in a case in which the signal generator 62 outputs, as the control signal, a pulsed current of a repetition frequency that is higher than the predetermined repetition frequency f generated by the trigger generator 8, seed light may be inputted at a high repetition frequency to the second fiber amplifier 42, which may suppress an increase in gain of the second fiber amplifier 42. Accordingly, in the period in which the burst signal Tb is off, the peak value of the light intensity of the seed light having been amplified by the second fiber amplifier 42 may become low. Thus, in the period in which the burst signal Tb is off, the second pulsed laser light 71B may be outputted at low light intensity from the second solid-state laser unit 12. As a result, in the period in which the burst signal Tb is off, wavelength conversion into a wavelength of 193.4 nm may be prevented in the wavelength conversion system 15.

(6.3 Workings)

According to the solid-state laser system 1D of the present embodiment, while the burst signal Tb is off, the light intensity of the second pulsed laser light 71B may be controlled so as to prevent wavelength conversion in the wavelength conversion system 15 and prevent outputting of the third pulsed laser light 71C. While the burst signal Tb is on, the light intensity of the first pulsed laser light 71A and the light intensity of the second pulsed laser light 71B may be controlled so as to cause the wavelength conversion system 15 to output the third pulsed laser light 71C with the third wavelength converted from the first wavelength and the second wavelength. While the burst signal Tb is off, the light intensity of the seed light may be suppressed in the second solid-state laser unit 12 so as to be become equal to or lower than the wavelength conversion threshold value in the wavelength conversion system 15, which may decrease the gain of the second fiber amplifier 42. This makes it possible to suppress an increase in the light intensity of the head pulse of the burst.

(6.4 Modification Example)

A combination of the present embodiment and the foregoing third embodiment may be adopted as an example embodiment. In this case, both the first optical shutter 23 and the semiconductor optical amplifier 41 may serve as the light intensity varying section. Accordingly, while the burst signal Tb is off, both the light intensity of the first pulsed laser light 71A and the light intensity of the second pulsed laser light 71B may be controlled to become low.

7. CONFIGURATION EXAMPLE OF OPTICAL SHUTTER

Figure 16:
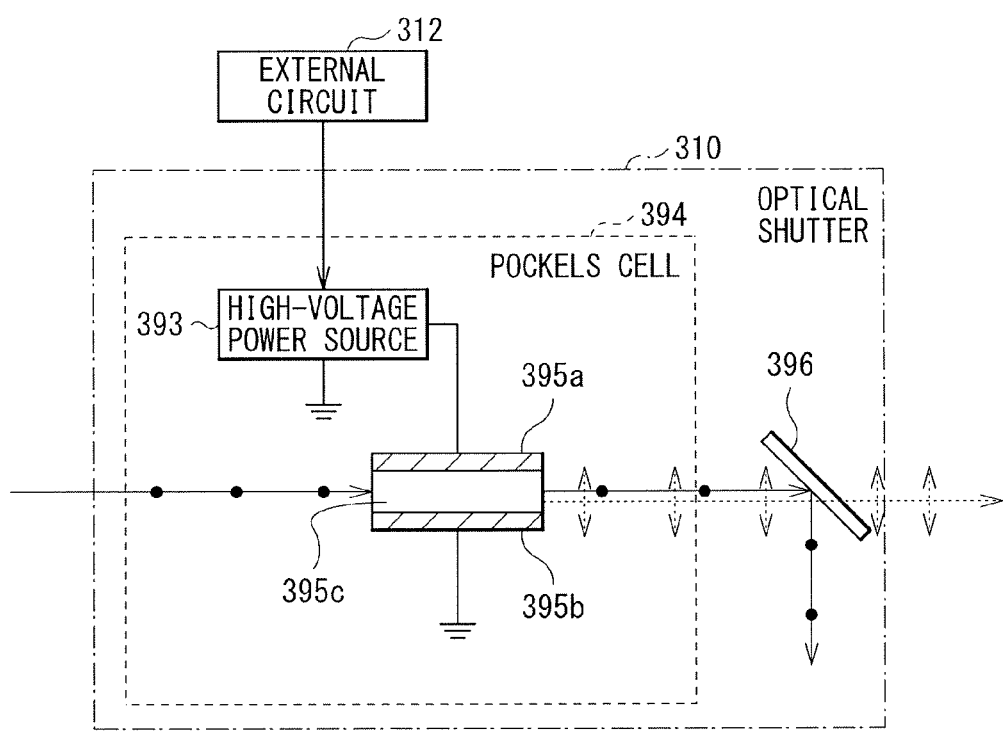
FIG. 16 schematically illustrates a configuration example of an optical shutter.

Next, description is given of a specific configuration example of an optical shutter 310 with reference to FIG. 16. The optical shutter 310 may be applicable as the first optical shutter 23 and the second optical shutter 28 mentioned above.

(7.1 Configuration)

FIG. 16 illustrates a configuration example of the optical shutter 310. The optical shutter 310 may include a Pockels cell 394 and a polarizer 396. The Pockels cell 394 may include a high-voltage power source 393, a first electrode 395*a*, a second electrode 395*b*, and an electrooptical crystal 395*c*. The first electrode 395*a* and the second electrode 395*b* may be oppositely disposed, and the electrooptical crystal 395*c* may be disposed between the first electrode 39*a* and the second electrode 395*b*. The high-voltage power source 393 may be controlled by a transmittance setting section 311 and an external circuit 312.

(7.2 Operation)

The high-voltage power source 393 may receive a pulse signal alternating between a predetermined voltage and 0 V as a control signal of the optical shutter 310 from the external circuit 312. The high-voltage power source 393 may apply a high voltage between the first electrode 395*a* and the second electrode 395*b* in accordance with the voltage of the pulse signal. At this occasion, when receiving, as the control signal of the optical shutter 310, a voltage that causes the optical shutter 310 to be opened, the high-voltage power source 393 may generate a high voltage that is not 0 V and maximizes transmittance, and may apply the voltage between the first electrode 395*a* and the second electrode 395*b*. When receiving, as the control signal of the optical shutter 310, 0 V that causes the optical shutter 310 to be closed, the high voltage power source 393 may set the voltage to be applied between the first electrode 395*a* and the second electrode 395*b* to 0 V.

At this occasion, non-limiting examples of the external circuit 312 may include the synchronous circuits 13 and 13B, and the burst pulse controller 3A.

The Pockels cell 394 may serve a function equivalent to a λ/2 plate when the high voltage that maximizes transmittance is applied between the first electrode 395*a* and the second electrode 395*b*. When 0 V is applied between the first electrode 395*a* and the second electrode 395*b*, light in a linear polarization direction perpendicular to a paper surface may pass through the electrooptical crystal 395*c* without changing the polarization state of the light and may be then reflected by the polarizer 396. In FIG. 16, the light that is linearly polarized in a direction perpendicular to the paper surface may be indicated by a black circle on a laser optical path. At this occasion, when the high voltage that maximizes the transmittance is applied, the phase is shifted by λ/2, and the linear polarized light in the direction perpendicular to the paper surface may be converted into linear polarized light in a direction including the paper surface. In FIG. 16, the light linearly polarized in the direction including the paper surface may be indicated by an arrow that is illustrated on the laser optical path and is perpendicular to the laser optical path. The light may pass through the polarizer 396. The optical shutter 310 may allow the light to pass therethrough at high transmittance during a period in which the high voltage is applied to the electrooptical crystal 395*c* as described above.

The Pockels cell 394 may have responsivity of about 1 ns, and may be therefore used as a high-speed optical shutter. Alternatively, for example, an acousto-optic (AO) device may be used as the optical shutter 310. In this case, the AO device may have responsivity of about several hundreds of ns, and may be therefore used as the optical shutter 310. Moreover, transmittance may be changed by changing the voltage to be applied between the first electrode 395*a* and the second electrode 395*b* in accordance with a voltage waveform from the external circuit 312.

It is to be noted that a polarizer and a λ/2 plate may be further added in an optical path on upstream side in the configuration of the optical shutter 310 in FIG. 16. Thus, the optical shutter 310 may serve as an optical isolator. In FIG. 16, the left side may be the upstream side and the right side may be the downstream side. In this case, when the predetermined high voltage is applied between the first electrode 395*a* and the second electrode 395*b* of the Pockels cell 94, the optical isolator may allow the light from both the upstream side and the downstream side to pass therethrough at high transmittance. In other words, the optical isolator may be opened. When the predetermined high voltage is not applied between the first electrode 395*a* and the second electrode 395*b*, the optical isolator may suppress transmission of the light from both the upstream side and the downstream side. In other words, the optical isolator may be closed.

8. HARDWARE ENVIRONMENT OF CONTROLLER

A person skilled in the art will appreciate that a general-purpose computer or a programmable controller may be combined with a program module or a software application to execute any subject matter disclosed herein. The program module, in general, may include one or more of a routine, a program, a component, a data structure, and so forth that each causes any process described in any example embodiment of the present disclosure to be executed.

Figure 18:
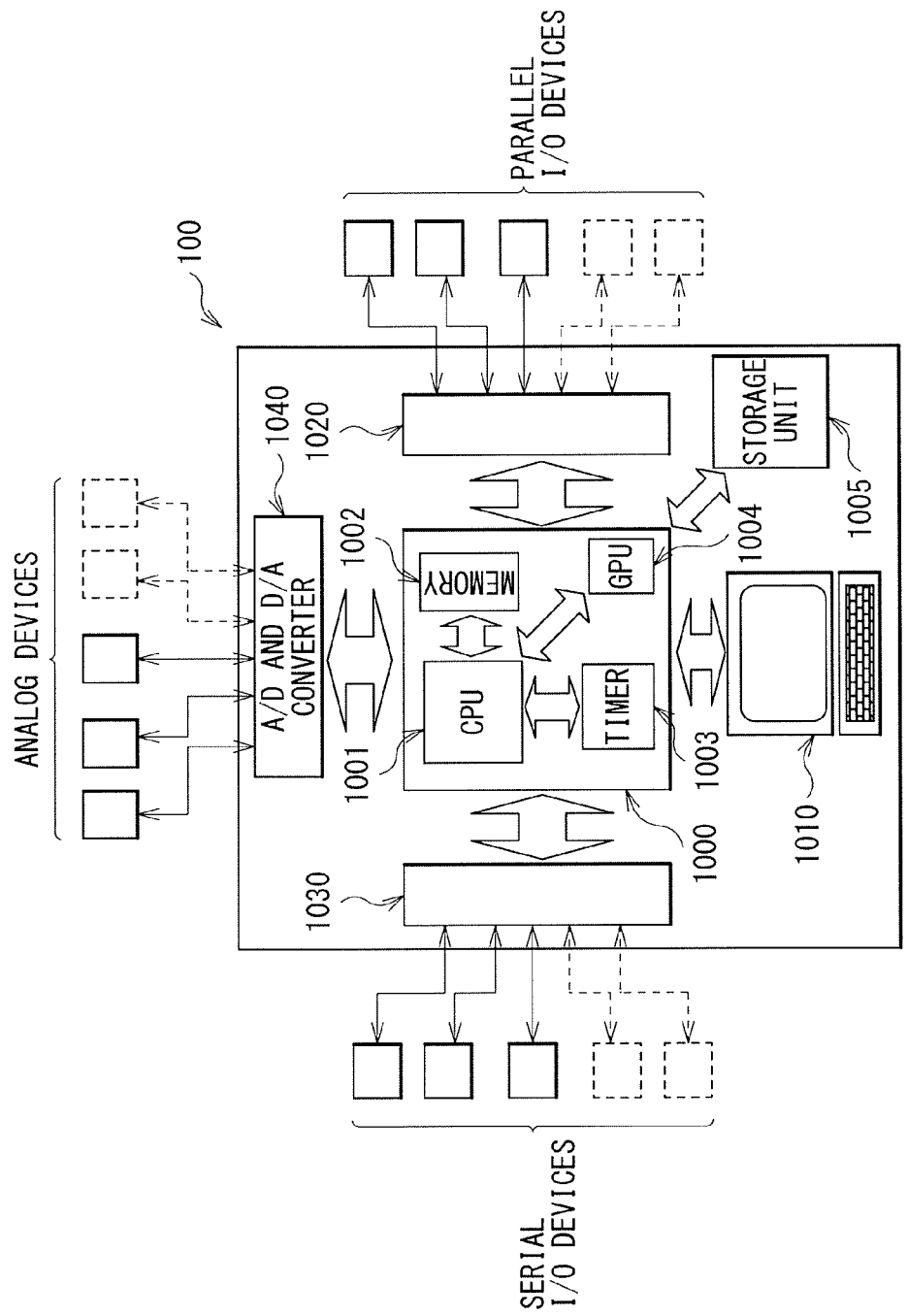
FIG. 18 illustrates an example of a hardware environment of a controller.

FIG. 18 is a block diagram illustrating an exemplary hardware environment in which various aspects of any subject matter disclosed therein may be executed. An exemplary hardware environment 100 in FIG. 18 may include a processing unit 1000, a storage unit 1005, a user interface 1010, a parallel input/output (I/O) controller 1020, a serial I/O controller 1030, and an analog-to-digital (A/D) and digital-to-analog (D/A) converter 1040. Note that the configuration of the hardware environment 100 is not limited thereto.

The processing unit 1000 may include a central processing unit (CPU) 1001, a memory 1002, a timer 1003, and a graphics processing unit (GPU) 1004. The memory 1002 may include a random access memory (RAM) and a read only memory (ROM). The CPU 1001 may be any commercially-available processor. A dual microprocessor or any other multi-processor architecture may be used as the CPU 1001.

The components illustrated in FIG. 18 may be coupled to one another to execute any process described in any example embodiment of the present disclosure.

Upon operation, the processing unit 1000 may load programs stored in the storage unit 1005 to execute the loaded programs. The processing unit 1000 may read data from the storage unit 1005 together with the programs, and may write data in the storage unit 1005. The CPU 1001 may execute the programs loaded from the storage unit 1005. The memory 1002 may be a work area in which programs to be executed by the CPU 1001 and data to be used for operation of the CPU 1001 are held temporarily. The timer 1003 may measure time intervals to output a result of the measurement to the CPU 1001 in accordance with the execution of the programs. The GPU 1004 may process image data in accordance with the programs loaded from the storage unit 1005, and may output the processed image data to the CPU 1001.

The parallel I/O controller 1020 may be coupled to parallel I/O devices operable to perform communication with the processing unit 1000, and may control the communication performed between the processing unit 1000 and the parallel I/O devices. Non-limiting examples of the parallel I/O devices may include the trigger generator 8, the amplifier controller 30, and the charger 31. The serial I/O controller 1030 may be coupled to a plurality of serial I/O devices operable to perform communication with the processing unit 1000, and may control the communication performed between the processing unit 1000 and the serial I/O devices. Non-limiting examples of serial I/O devices may include the burst pulse controllers 3, 3A, 3B, 3C, and 3D, the exposure apparatus controller 5, the solid-state laser controller 14, and the synchronous circuit 13. The A/D and D/A converter 1040 may be coupled to various kinds of sensors and analog devices through respective analog ports. Non-limiting examples of the analog devices may include the first optical shutter 23, the second optical shutter 28, and the semiconductor optical amplifier 41. The A/D and D/A converter 1040 may control communication performed between the processing unit 1000 and the analog devices, and may perform analog-to-digital conversion and digital-to-analog conversion of contents of the communication.

The user interface 1010 may provide an operator with display showing a progress of the execution of the programs executed by the processing unit 1000, such that the operator is able to instruct the processing unit 1000 to stop execution of the programs or to execute an interruption routine.

The exemplary hardware environment 100 may be applied to one or more of configurations of the burst pulse controllers 3, 3A, 3B, 3C, and 3D, the solid-state laser controller 14, and other controllers according to any example embodiment of the present disclosure. A person skilled in the art will appreciate that such controllers may be executed in a distributed computing environment, namely, in an environment where tasks may be performed by processing units linked through any communication network. In any example embodiment of the present disclosure, unillustrated controllers used for an exposure apparatus laser that integrally control controllers such as the burst pulse controllers 3, 3A, 3B, 3C, and 3D, and the solid-state laser controller 14 may be coupled to one another through a communication network such as Ethernet® or the Internet. In the distributed computing environment, the program module may be stored in each of local and remote memory storage devices.

9. ET CETERA

The foregoing description is intended to be merely illustrative rather than limiting. It should therefore be appreciated that variations may be made in example embodiments of the present disclosure by persons skilled in the art without departing from the scope as defined by the appended claims.

The terms used throughout the specification and the appended claims are to be construed as "open-ended" terms. For example, the term "include" and its grammatical variants are intended to be non-limiting, such that recitation of items in a list is not to the exclusion of other like items that can be substituted or added to the listed items. The term "have" and its grammatical variants are intended to be non-limiting, such that recitation of items in a list is not to the exclusion of other like items that can be substituted or added to the listed items. Also, the singular forms "a", "an", and "the" used in the specification and the appended claims include plural references unless expressly and unequivocally limited to one referent.

What is claimed is:

1. A solid-state laser system, comprising:
   a first solid-state laser unit configured to output first pulsed laser light with a first wavelength;
   a second solid-state laser unit including a semiconductor optical amplifier and configured to output second pulsed laser light with a second wavelength;
   a wavelength conversion system where the first pulsed laser light and the second pulsed laser light enter; and
   a controller coupled to the first solid-state laser unit and the semiconductor optical amplifier, and configured to control the first solid-state laser unit and the semiconductor optical amplifier to cause the first pulsed laser light and the second pulsed laser light to be continuously outputted from the first solid-state laser unit and the second solid-state laser unit, respectively, the controller being configured to control the first solid-state laser unit and the semiconductor optical amplifier to cause, while a burst signal from an external unit is on, the first pulsed laser light and the second pulsed laser light to enter the wavelength conversion system at a coincidental timing, thereby causing the wavelength conversion system to output third pulsed laser light with a third wavelength that is converted from the first wavelength and the second wavelength, and being configured to control the first solid-state laser unit and the semiconductor optical amplifier to cause, while the burst signal is off, the first pulsed laser light and the second pulsed laser light to enter the wavelength conversion system at different timings from each other, thereby preventing the wavelength conversion system from outputting the third pulsed laser light, a difference between the different timings being equal to or greater than sum of a pulse width of the first pulsed laser light and a pulse width of the second pulsed laser light.

2. The solid-state laser system according to claim 1, further comprising a synchronous circuit configured to output, in synchronization with a first trigger signal, a second trigger signal and a third trigger signal, the second trigger signal causing the first pulsed laser light to be outputted from the first solid-state laser unit, and the third trigger signal causing the second pulsed laser light to be outputted from the semiconductor optical amplifier,
   wherein the controller controls, in synchronization with the burst signal, the synchronous circuit to cause the first pulsed laser light and the second pulsed laser light to enter the wavelength conversion system at the coincidental timing while the burst signal is on, and to cause the first pulsed laser light and the second pulsed laser light to enter the wavelength conversion system at the different timings from each other while the burst signal is off.

3. The solid-state laser system according to claim 1, wherein the external unit is an exposure apparatus.

4. The solid-state laser system according to claim 1, wherein the first wavelength is 257.5 nanometers.

5. The solid-state laser system according to claim 1, wherein the first solid-state laser unit includes a first laser diode and an optical shutter.

6. The solid-state laser system according to claim 5, wherein the optical shutter trims continuous-wave-oscillated light outputted by the first laser diode into a pulse form.

7. The solid-state laser system according to claim 5, wherein
the optical shutter is coupled to the controller, and
the controller controls a timing at which the optical shutter synchronizes with the semiconductor optical amplifier.

8. The solid-state laser system according to claim 5, wherein the first laser diode outputs light with a wavelength of 1030 nanometers.

9. The solid-state laser system according to claim 1, wherein the first solid-state laser unit includes an LBO crystal and a CLBO crystal.

10. The solid-state laser system according to claim 1, wherein the second wavelength is 1554 nanometers.

11. The solid-state laser system according to claim 1, wherein the second solid-state laser unit includes a second laser diode.

12. The solid-state laser system according to claim 11, wherein the semiconductor optical amplifier amplifies continuous-wave-oscillated light outputted by the second laser diode into a pulse form.

13. The solid-state laser system according to claim 11, wherein the second laser diode outputs light with a wavelength of 1554 nanometers.

14. The solid-state laser system according to claim 1, wherein the wavelength conversion system includes two CLBO crystals.

15. The solid-state laser system according to claim 14, wherein the two CLBO crystals each output a sum frequency of light that has entered corresponding one of the two CLBO crystals.

16. The solid-state laser system according to claim 1, wherein the third wavelength is 193.4 nanometers.

* * * * *